(12) United States Patent
Barber et al.

(10) Patent No.: US 10,971,418 B2
(45) Date of Patent: Apr. 6, 2021

(54) PACKAGING STRUCTURES WITH IMPROVED ADHESION AND STRENGTH

(71) Applicant: SKYWORKS SOLUTIONS, INC., Irvine, CA (US)

(72) Inventors: Bradley Paul Barber, Acton, MA (US); Kezia Cheng, Lowell, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/573,344

(22) Filed: Sep. 17, 2019

(65) Prior Publication Data
US 2020/0013689 A1    Jan. 9, 2020

Related U.S. Application Data

(62) Division of application No. 15/673,569, filed on Aug. 10, 2017, now Pat. No. 10,453,763.
(Continued)

(51) Int. Cl.
*H01L 23/31* (2006.01)
*H01L 21/56* (2006.01)
(Continued)

(52) U.S. Cl.
CPC ........ *H01L 23/3114* (2013.01); *B81B 7/0077* (2013.01); *H01L 21/56* (2013.01); *H01L 23/3157* (2013.01); *H01L 24/26* (2013.01); *H01L 2224/05554* (2013.01); *H01L 2224/49171* (2013.01); *H01L 2924/00014* (2013.01); *H01L 2924/078* (2013.01); *H01L 2924/1611* (2013.01); *H01L 2924/1615* (2013.01); *H01L 2924/183* (2013.01); *H01L 2924/186* (2013.01);
(Continued)

(58) Field of Classification Search
CPC ............. H01L 23/3114; H01L 23/3157; H01L 23/3142; H01L 21/56; H01L 2924/1611; H01L 2924/1811; H01L 2924/186
See application file for complete search history.

(56) References Cited

U.S. PATENT DOCUMENTS 5,561,085 A    10/1996 Gorowitz et al.
5,668,033 A    9/1997 Ohara et al.
(Continued)

OTHER PUBLICATIONS

Chao et al., "Microcap Selective Packaging through Flip Chip Assignment", NSTI-Nanotech 2004, vol. 3, 2004, pp. 472-475 (Year: 2004).*
(Continued)

*Primary Examiner* — Joseph C. Nicely
(74) *Attorney, Agent, or Firm* — Lando & Anastasi, LLP

(57) ABSTRACT

According to various aspects and embodiments, a support structure for packaging an electronic device is provided. In one example, a packaged electronic device includes a substrate, at least one electronic device disposed on the substrate, an encapsulation structure disposed on the substrate and having a wall that forms a perimeter around the at least one electronic device, and at least one support structure formed from a photosensitive polymer and disposed adjacent the wall of the encapsulation structure. The at least one support structure has a configuration that provides at least one of increased adhesion and mechanical strength to the encapsulation structure.

14 Claims, 30 Drawing Sheets

Related U.S. Application Data

(60) Provisional application No. 62/373,061, filed on Aug. 10, 2016.

(51) Int. Cl.
    *H01L 23/00* (2006.01)
    *B81B 7/00* (2006.01)

(52) U.S. Cl.
    CPC .......... *H01L 2924/1811* (2013.01); *H01L 2924/1815* (2013.01)

(56) References Cited

U.S. PATENT DOCUMENTS

| | | | |
|---|---|---|---|
| 5,773,198 A | 6/1998 | Swirbel et al. | |
| 6,444,111 B1 | 9/2002 | Montgomery | |
| 6,635,412 B2 | 10/2003 | Afromowitz | |
| 6,777,267 B2 | 8/2004 | Ruby et al. | |
| 7,598,118 B2 | 10/2009 | Sugiura et al. | |
| 7,635,636 B2 | 12/2009 | McClure et al. | |
| 7,875,230 B2 | 1/2011 | Silverbrook | |
| 7,892,962 B2 | 2/2011 | Su | |
| 7,955,885 B1 | 6/2011 | Bhugra et al. | |
| 8,367,477 B2 | 2/2013 | Chien et al. | |
| 8,617,927 B1 | 12/2013 | Margomenos et al. | |
| 2002/0102477 A1 | 8/2002 | Tanaka et al. | |
| 2003/0020061 A1 | 1/2003 | Emerson et al. | |
| 2004/0213955 A1 | 10/2004 | Boyle et al. | |
| 2005/0189621 A1 | 9/2005 | Cheung | |
| 2006/0006511 A1 | 1/2006 | Roh et al. | |
| 2006/0214292 A1 | 9/2006 | Agraharam et al. | |
| 2006/0220173 A1 | 10/2006 | Gan et al. | |
| 2007/0020807 A1 | 1/2007 | Geefay et al. | |
| 2007/0042527 A1 | 2/2007 | Tuckerman et al. | |
| 2007/0176250 A1 | 8/2007 | Lee et al. | |
| 2007/0243662 A1 | 10/2007 | Johnson et al. | |
| 2007/0279152 A1 | 12/2007 | Kawamura | |
| 2008/0038874 A1 | 2/2008 | Lin | |
| 2008/0067664 A1 | 3/2008 | Lim et al. | |
| 2008/0283198 A1 | 11/2008 | Papworth et al. | |
| 2008/0299288 A1 | 12/2008 | Kobrin et al. | |
| 2009/0121303 A1 | 5/2009 | Chen et al. | |
| 2010/0116527 A1 | 5/2010 | Khosla et al. | |
| 2010/0230795 A1 | 9/2010 | Kriman et al. | |
| 2010/0230803 A1 | 9/2010 | Chien et al. | |
| 2010/0270919 A1 | 10/2010 | Hubert et al. | |
| 2011/0115036 A1 | 5/2011 | Moon et al. | |
| 2011/0210413 A1 | 9/2011 | Huang et al. | |
| 2011/0234055 A1 | 9/2011 | Fukano et al. | |
| 2012/0094418 A1 | 4/2012 | Grama et al. | |
| 2013/0061756 A1 | 3/2013 | Hung et al. | |
| 2013/0062995 A1 | 3/2013 | Matsuda et al. | |
| 2013/0069241 A1 | 3/2013 | Lin et al. | |
| 2013/0082376 A1 | 4/2013 | Nagarkar et al. | |
| 2013/0147036 A1 | 6/2013 | Choi et al. | |
| 2013/0200528 A1 | 8/2013 | Lin et al. | |
| 2013/0241038 A1 | 9/2013 | Parikh et al. | |
| 2013/0249095 A1 | 9/2013 | Shen | |
| 2013/0249109 A1 | 9/2013 | Ma et al. | |
| 2013/0306943 A1 | 11/2013 | Kato et al. | |
| 2013/0330878 A1 | 12/2013 | Ararao | |
| 2014/0015122 A1 | 1/2014 | Chou et al. | |
| 2014/0015373 A1 | 1/2014 | Kanae | |
| 2014/0191617 A1 | 7/2014 | Ohashi et al. | |
| 2014/0264230 A1 | 9/2014 | Borodulin et al. | |
| 2014/0319522 A1 | 10/2014 | Daubenspeck et al. | |
| 2014/0327131 A1 | 11/2014 | Yeh et al. | |
| 2015/0014820 A1 | 1/2015 | Owada | |
| 2015/0188024 A1 | 7/2015 | Ishigami et al. | |
| 2015/0210537 A1 | 7/2015 | Chang et al. | |
| 2015/0266726 A1 | 9/2015 | Gudeman et al. | |
| 2015/0277099 A1 | 10/2015 | Hong et al. | |
| 2015/0357302 A1 | 12/2015 | Chen et al. | |
| 2016/0037649 A1 | 2/2016 | Barber | |
| 2017/0086320 A1 | 3/2017 | Barber | |
| 2017/0178992 A1 | 6/2017 | Jeong et al. | |
| 2017/0236742 A1 | 8/2017 | Yota et al. | |
| 2017/0243739 A1 | 8/2017 | Barber et al. | |
| 2017/0271270 A1 | 9/2017 | Dias et al. | |
| 2017/0345676 A1 | 11/2017 | Cheng | |
| 2017/0365554 A1 | 12/2017 | Barber et al. | |
| 2018/0047650 A1 | 2/2018 | Barber et al. | |
| 2020/0243369 A1 | 7/2020 | Yota et al. | |

OTHER PUBLICATIONS

Kim, Y.K. et al., "A Novel Low-Temperature Microcap Packaging using SU-8 Bonding," Solid-State Sensors, Actuators and Microsystems Conference, Jun. 10-14, 2007. (Year: 2007).*

Steigert et al., "A versatile and flexible low-temperature full-wafer bonding process of monolithic 3D microfluidic structures in SU-8", Journal of Micromechanics and Microengineering, 18 (2008), 095013, pp. 1-8. (Year: 2008).*

Chao et al., "Microcap Selective Packaging through Flip Chip Alignment", NSTI-Nanotech 2004, vol. 3, 2004, pp. 472-475.

Kim, Y.K. et al., "A Novel Low-Temperature Microcap Packaging using SU-8 Bonding," Solid-State Sensors, Actuators and Microsystems Conference, Jun. 10-14, 2007.

Steigert et al., "A versatile and flexible low-temperature full-wafer bonding process of monolithic 3D microfluidic structures in SU-8", Journal of Micromechanics and Microengineering, 18 (2008), 095013, pp. 1-8.

* cited by examiner

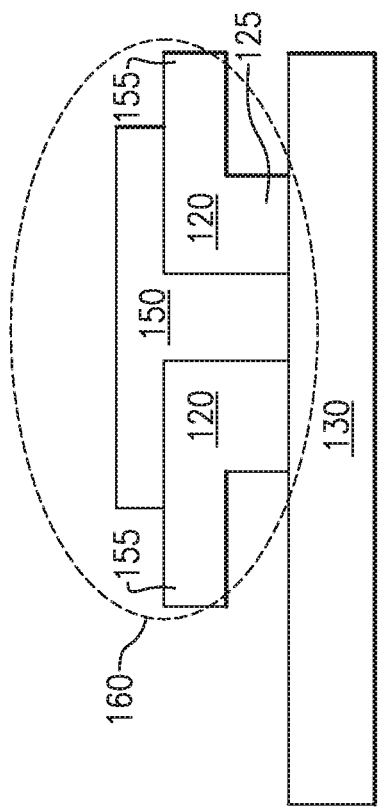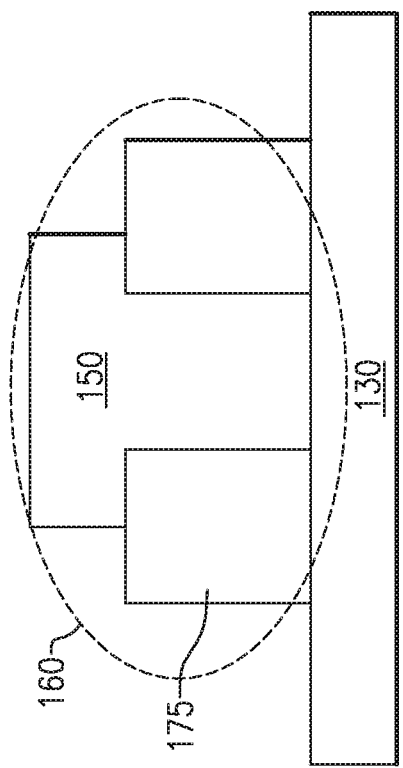

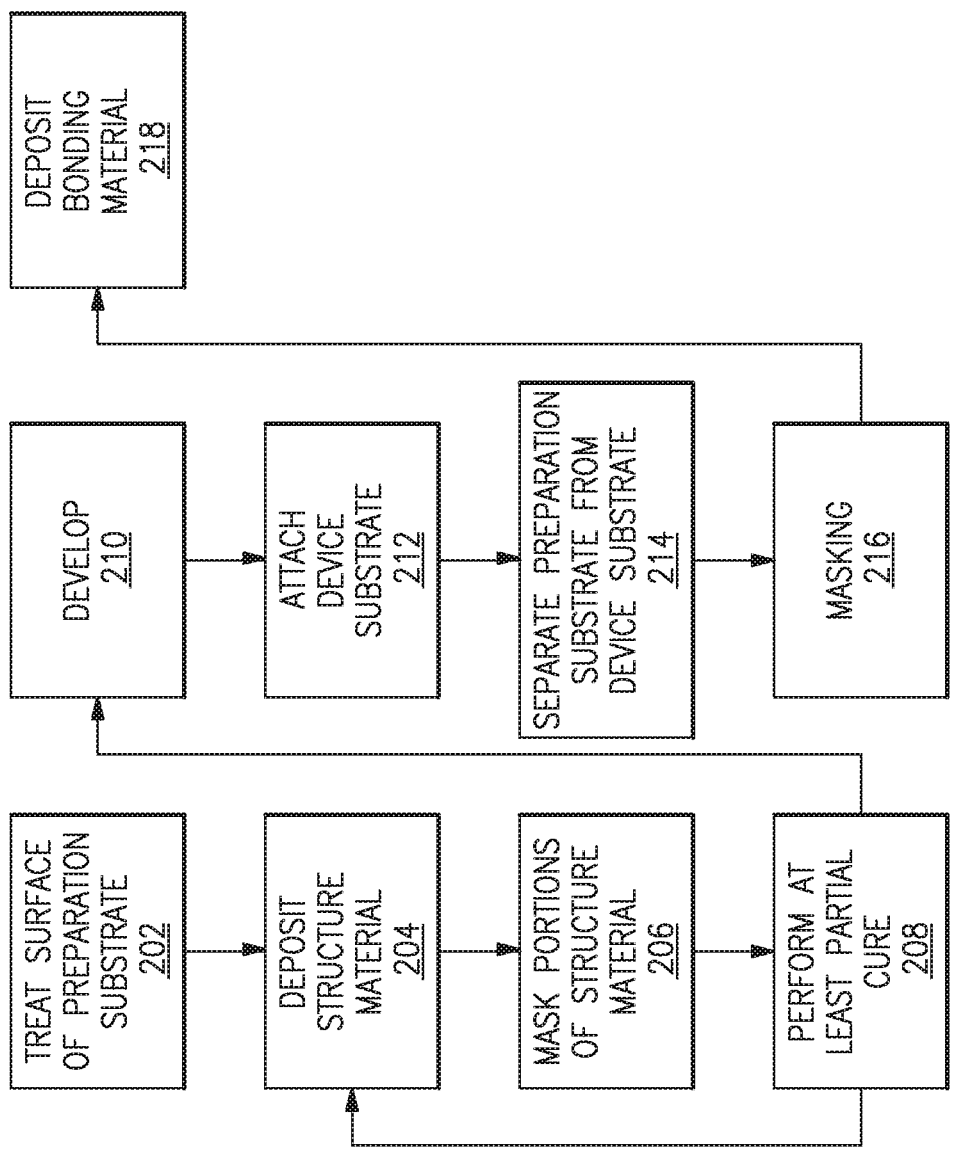

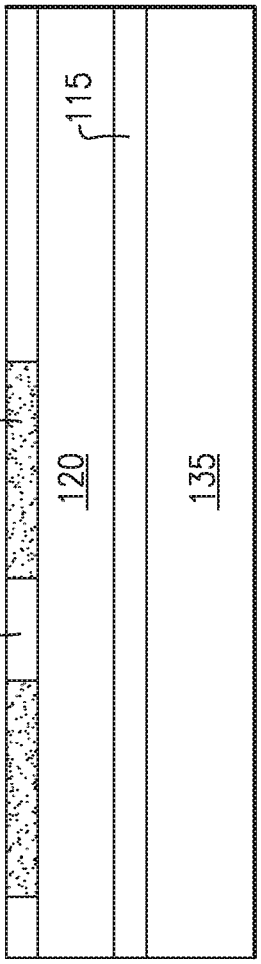
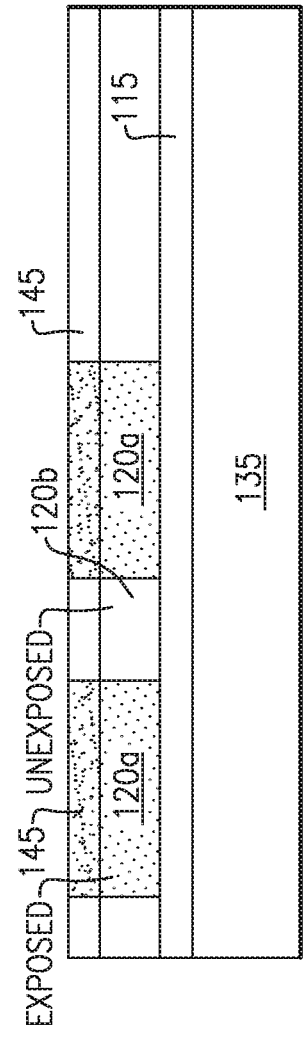
FIG. 5
FIG. 6

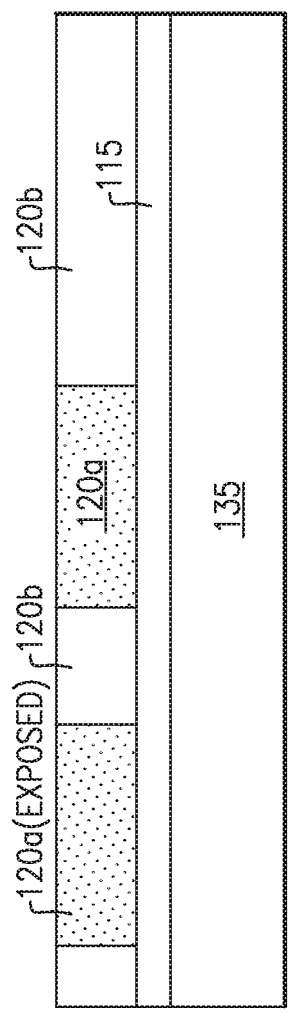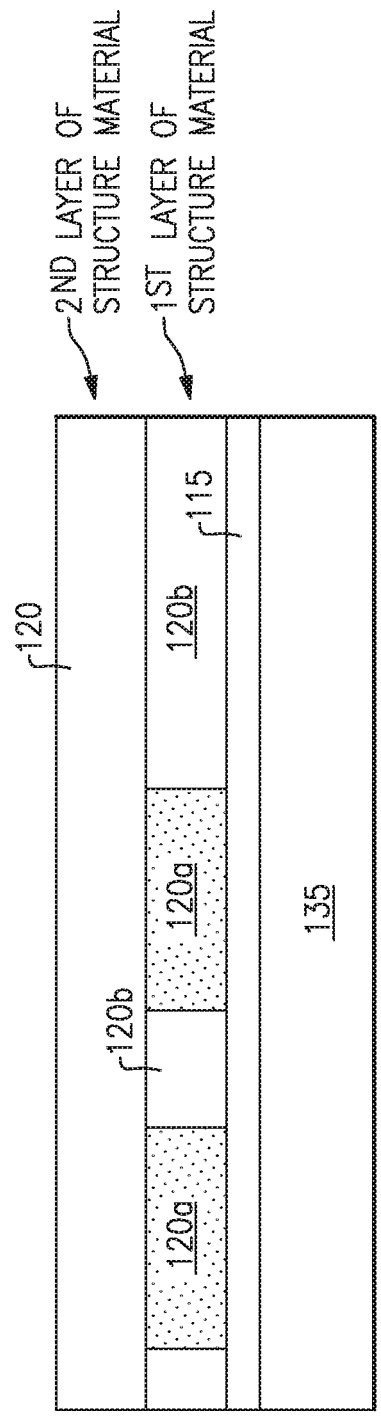

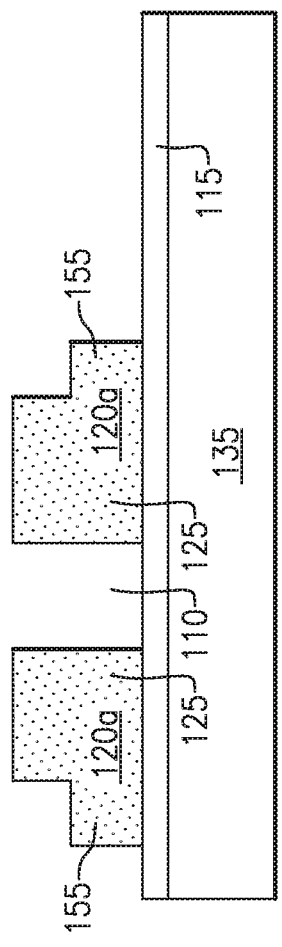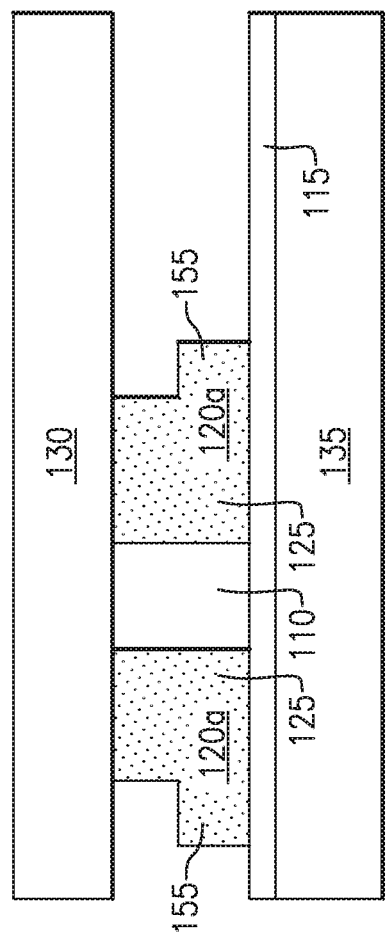

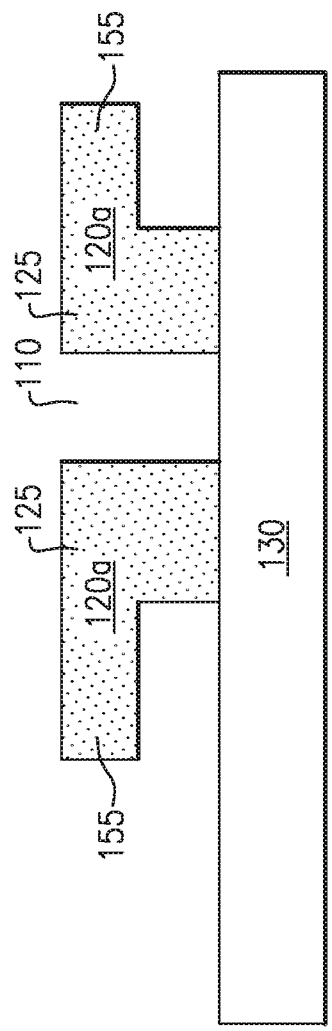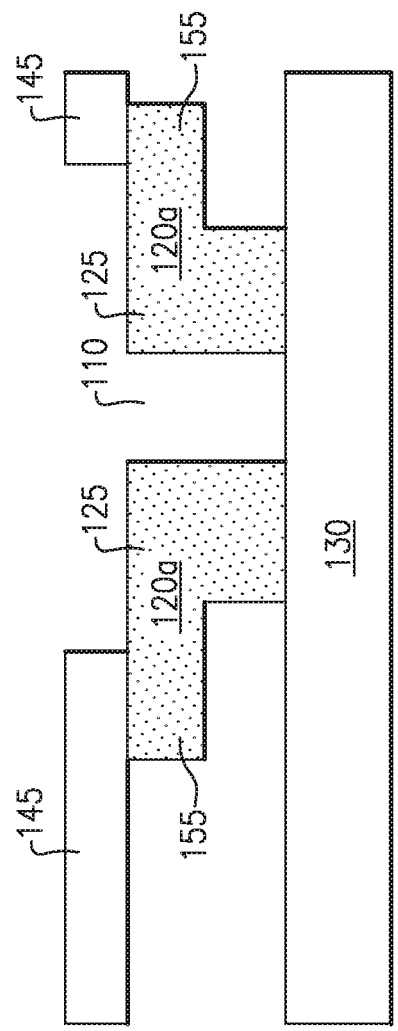

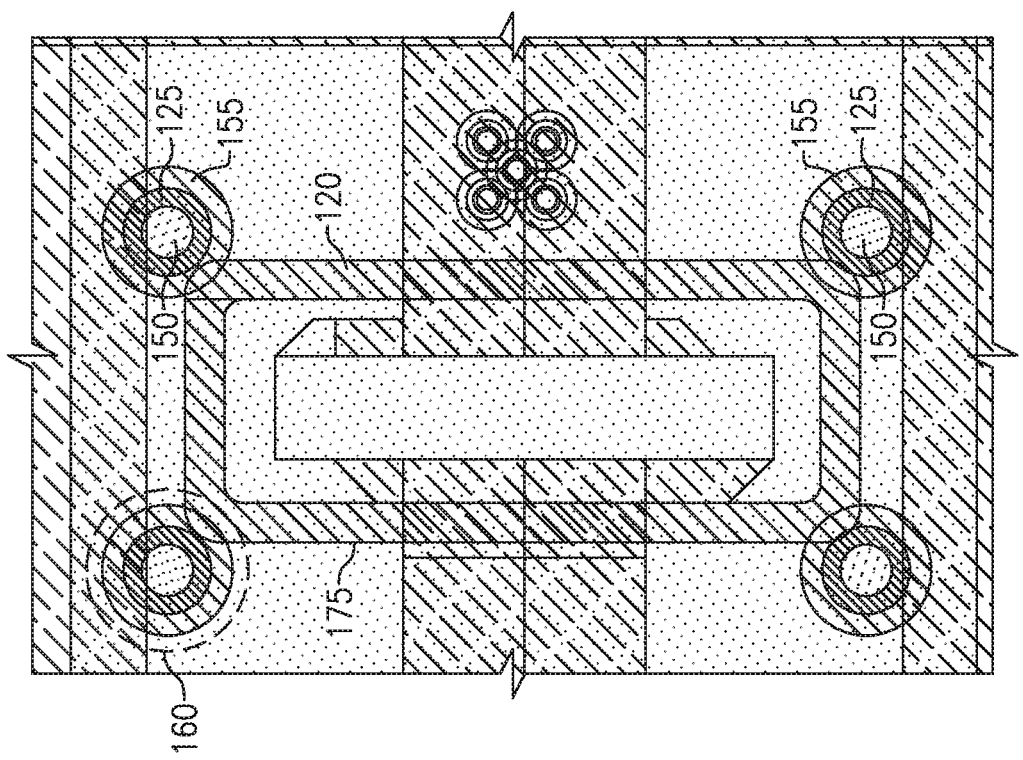

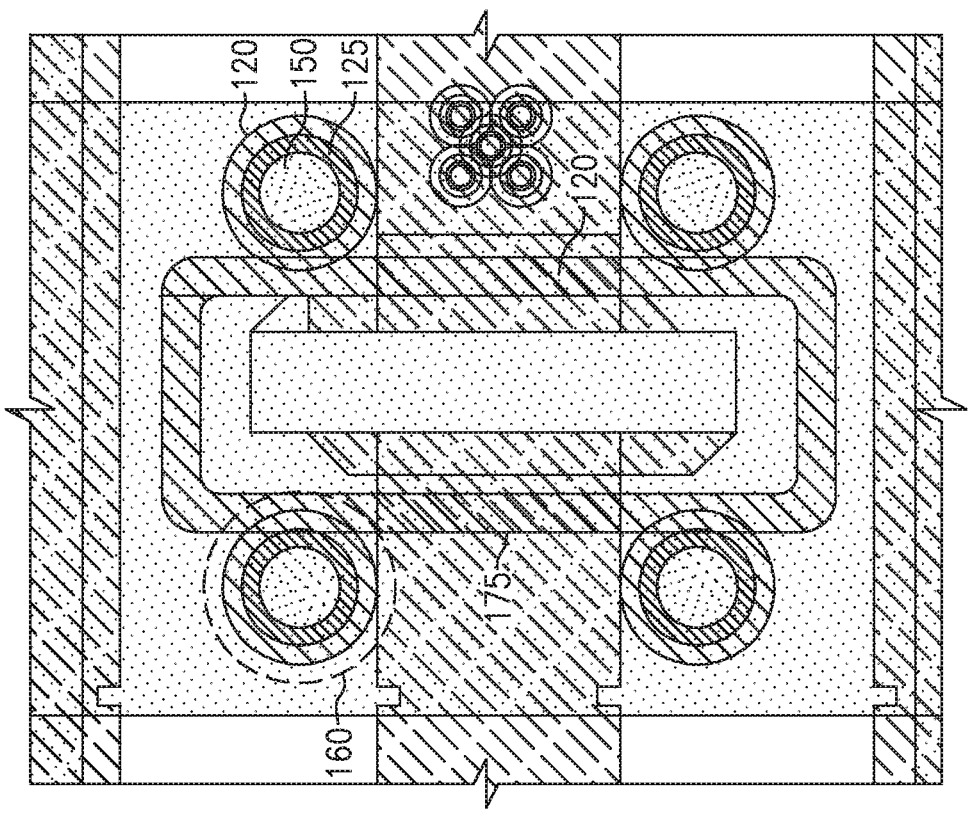

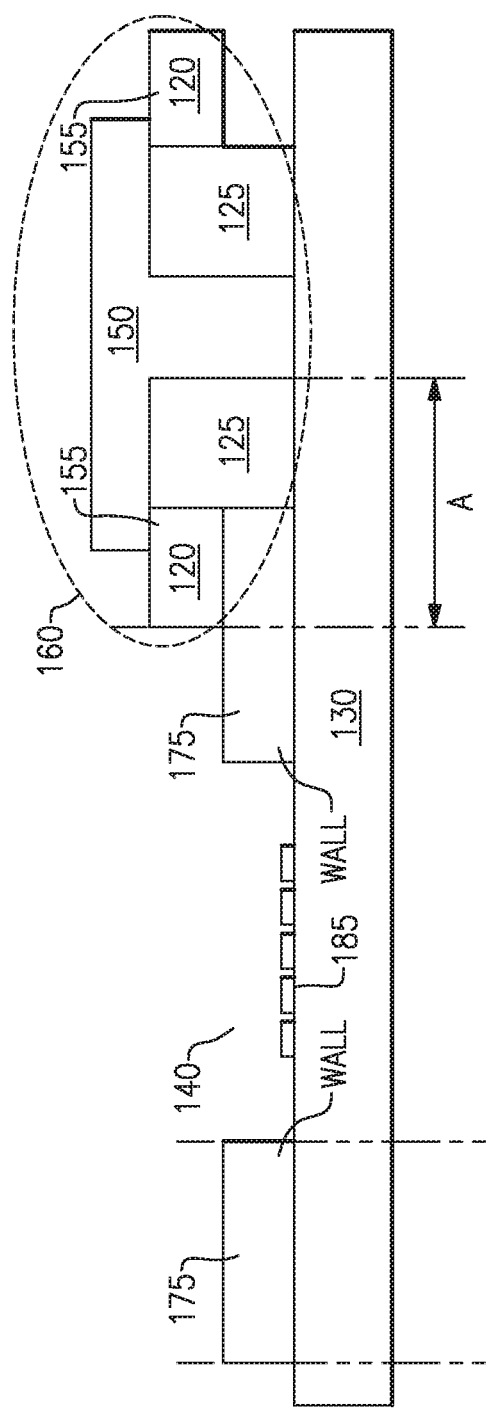

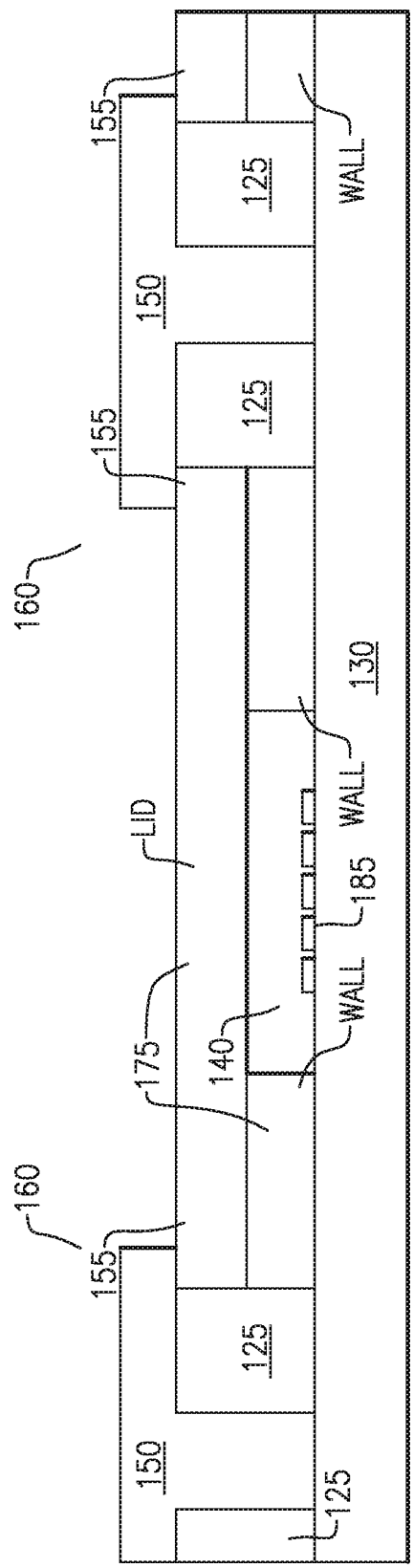

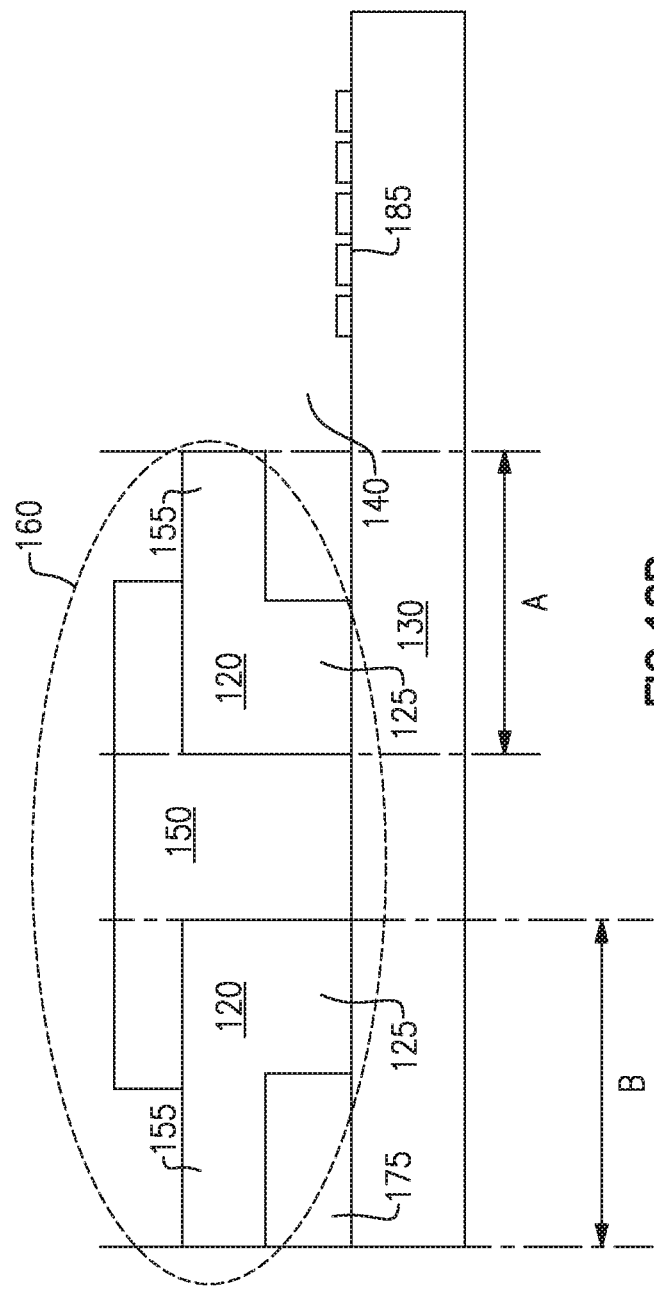

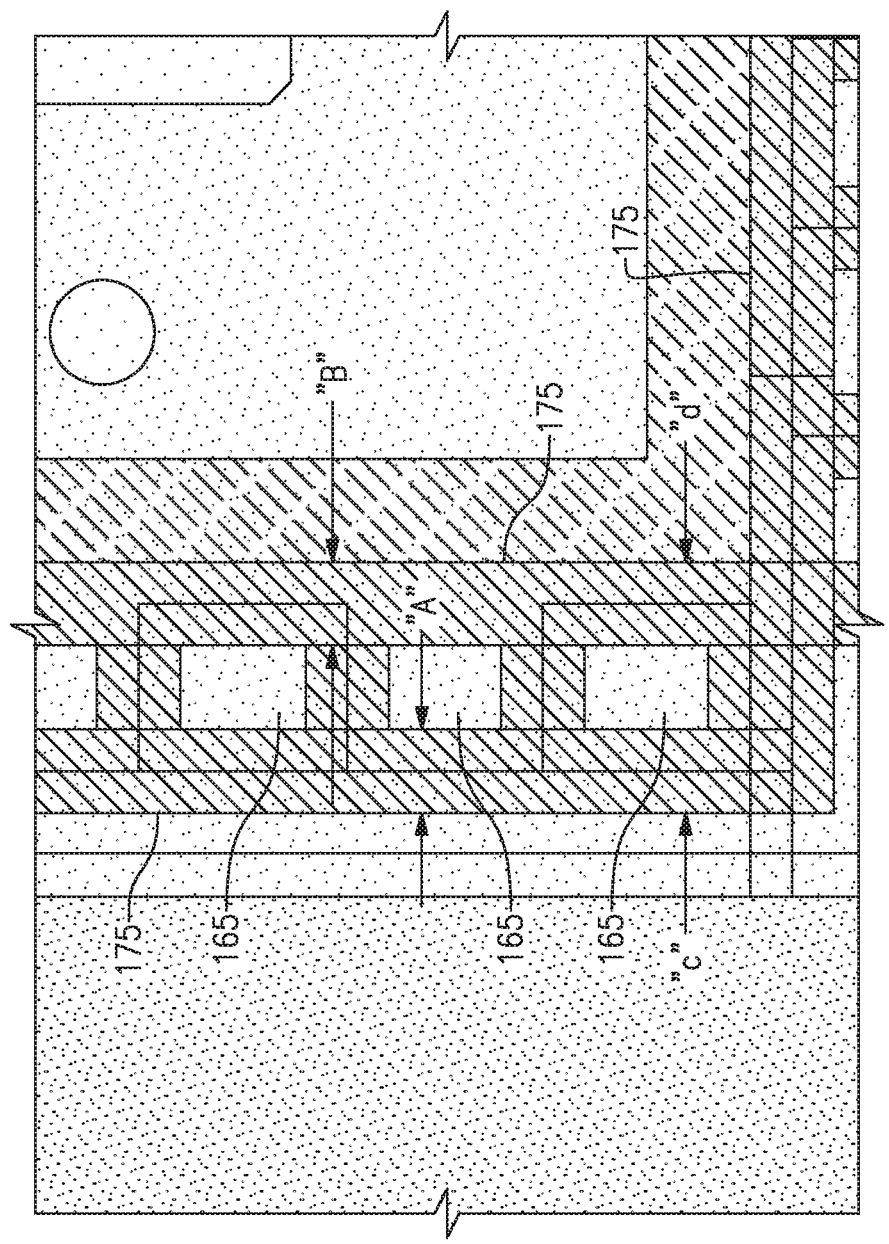

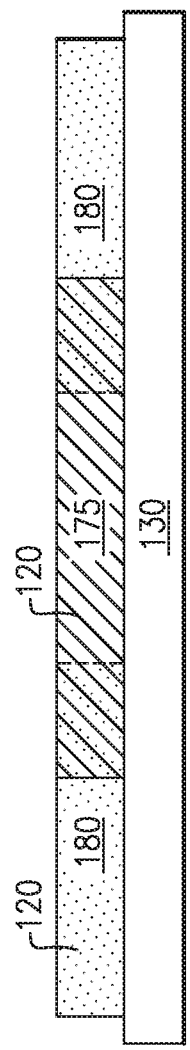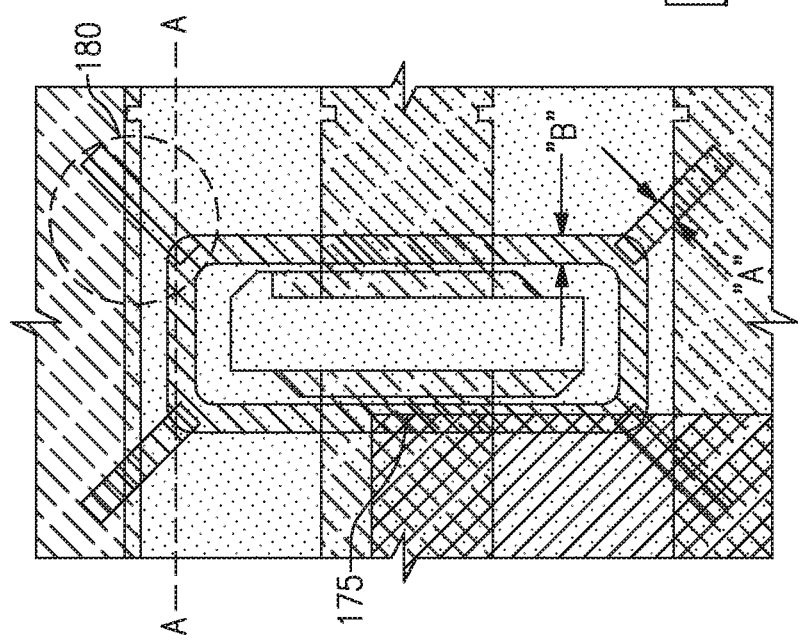

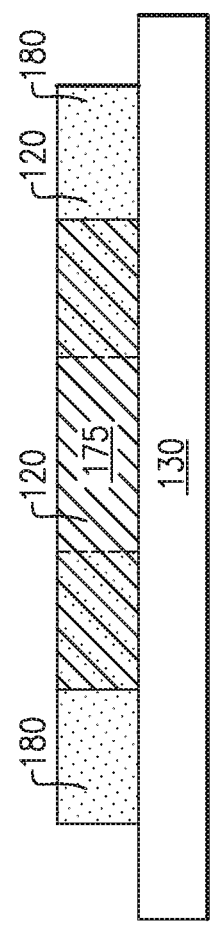
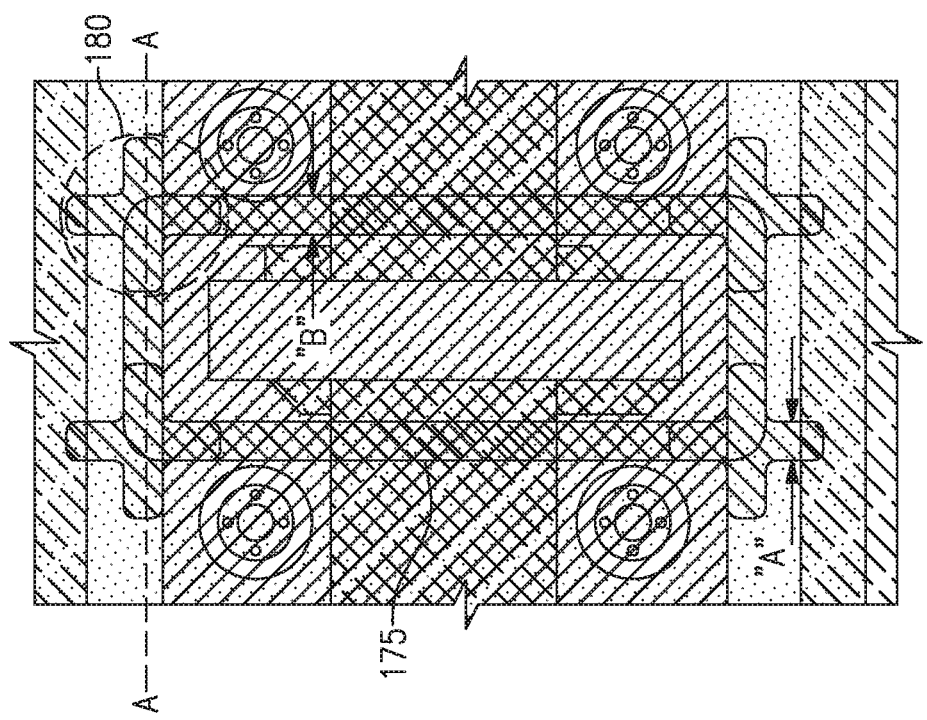
FIG.20E

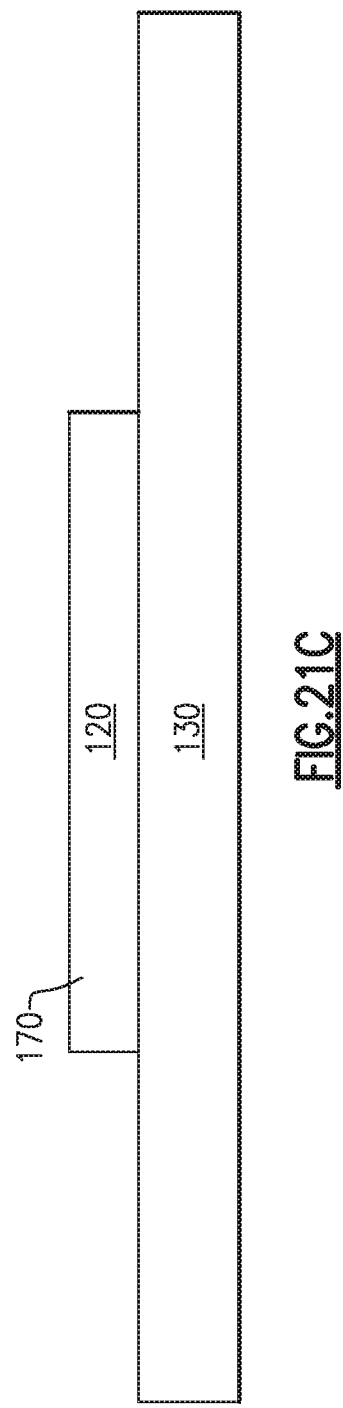

US 10,971,418 B2

PACKAGING STRUCTURES WITH IMPROVED ADHESION AND STRENGTH

CROSS-REFERENCE TO RELATED APPLICATIONS

This application claims the benefit under 35 U.S.C. § 121 as a division of co-pending U.S. patent application Ser. No. 15/673,569, titled "PACKAGING STRUCTURES WITH IMPROVED ADHESION AND STRENGTH," filed on Aug. 10, 2017, which in turn claims the benefit under 35 U.S.C. § 119(e) of U.S. Provisional Application No. 62/373,061, titled "PACKAGING STRUCTURES WITH IMPROVED ADHESION AND STRENGTH," filed on Aug. 10, 2016. Each of these applications is herein incorporated by reference in its entirety for all purposes.

BACKGROUND

Polymer materials are useful in a wide variety of technical applications, such as wafer-level packaging (WLP), semiconductor device fabrication, and microfluidic systems. For instance, polymer materials are capable of being layered and patterned to create three-dimensional (3D) microstructures for WLP applications or can be integrated into device structures. These structures can be fabricated using one or more manufacturing methods developed for semiconductor fabrication, such as polymer film coating, photosensitive film patterning, wafer-to-wafer bonding, etc. These methods may be scaled to produce structures having features with sizes in the micron to mm size scale. One example of a 3D transferable structure is discussed in U.S. patent application Ser. No. 15/440,233, filed Feb. 23, 2017 (hereinafter "the '233 application"), which is incorporated herein by reference in its entirety. Certain polymers are light-sensitive, such as those used in the '233 application, meaning that the material may be exposed to light to effect curing. It has been found that one problem with these types of materials is that they shrink during the polymerization or cure process. This shrinkage may detrimentally impact the mechanical functionality of the structure. Furthermore, as die sizes become smaller and smaller, there is less surface area available for the polymer material to adhere to an underlying substrate.

SUMMARY

The present disclosure relates generally to the field of semiconductor wafer processing technology. In particular, aspects and embodiments of the present invention relate to a packaging structure with improved adhesion and mechanical strength. According to various aspects of the present invention, a set of support structures for packaging an electronic device is provided. The packaging structure may be implemented in any one of a number of different types of electronic devices, such as semiconductor devices, MEMS devices, and microfluidic devices.

In accordance with one or more aspects of the invention, a method of packaging an electronic device is provided. The method comprises depositing a layer of temporary bonding material onto a surface of a first substrate, depositing a layer of structure material onto the temporary bonding material, forming at least one opening through the layer of structure material, forming a sleeve structure around at least a portion of a perimeter of the at least one opening, attaching a second substrate to at least a portion of the sleeve structure, the electronic device disposed on a surface of the second substrate, separating the first substrate from the second substrate, and depositing a bonding material into an opening within the sleeve structure.

In some embodiments, depositing the bonding material further comprises depositing the bonding material onto an upper surface of the sleeve structure and at least a portion of an upper surface of the layer of structure material. In some embodiments, attaching the second substrate further includes aligning the sleeve structure with an encapsulation structure that forms a perimeter around the electronic device and is disposed on the surface of the second substrate. In some embodiments, a portion of the layer of structure material is configured to form a collar around the sleeve structure. In some embodiments, a portion of the collar is attached to the encapsulation structure. In some embodiments, at least a portion of the collar forms a portion of the encapsulation structure. In some embodiments, at least a portion of the collar forms a portion of a lid of the encapsulation structure.

According to some embodiments, at least one dimension of the sleeve structure and the collar is substantially the same as at least one dimension of the encapsulation structure. In some embodiments, a width dimension of the sleeve structure and the collar is substantially the same as a width dimension of a wall of the encapsulation structure. In some embodiments, a portion of a wall of the sleeve structure is aligned to be adjacent at least one corner of the encapsulation structure. In some embodiments, a portion of a wall of the sleeve structure is aligned to be adjacent at least one sidewall of the encapsulation structure.

In some embodiments, the method further comprises forming at least one opening in the encapsulation structure. In some embodiments, the method further comprises depositing the bonding material into the at least one opening in the encapsulation structure. In some embodiments, the bonding material is a metal material. In some embodiments, the metal material forms an interconnect to the electronic device.

According to some embodiments, the sleeve structure is formed from at least one layer of structure material. In some embodiments, the layer of structure material is a polymer.

In some embodiments, depositing the layer of structure material comprises spin coating the layer of structure material.

In some embodiments, forming the at least one opening comprises: masking at least a portion of the layer of structure material to define an unmasked portion and a masked portion such that a masked portion corresponds to the at least one opening, performing at least a partial cure of the unmasked portion of the layer of structure material, and developing the masked portion of the layer of structure material.

According to some embodiments, depositing the bonding material comprises evaporating or plating the bonding material into the at least one opening.

In accordance with another aspect, an attachment structure for packaging an electronic device disposed on a substrate is provided. The attachment structure comprises: a collar formed from a layer of structure material, a sleeve formed around an opening that extends through the sleeve, the sleeve having an upper surface and a lower surface, the lower surface attached to the substrate, and a bonding cap formed within the opening that extends through the sleeve from the upper surface to the lower surface and extends across the upper surface of the sleeve and onto a portion of an upper surface of the collar.

In some embodiments, an encapsulation structure is disposed on the substrate, the encapsulation structure having a wall that forms a perimeter around the electronic device, and a portion of a side surface of the sleeve is positioned adjacent the wall. In some embodiments, a portion of the collar is attached to the wall of the encapsulation structure. In some embodiments, the encapsulation structure further includes a lid attached to at least a portion of the wall, and at least a portion of the collar is attached to the lid. In some embodiments, the collar forms at least a portion of the lid. According to some embodiments, the attachment structure is positioned at multiple locations adjacent the wall of the encapsulation structure. In some embodiments, at least one dimension of the collar and the sleeve is substantially the same as at least one dimension of the wall of the encapsulation structure. In some embodiments, a width of the collar and the sleeve is substantially the same as a width of the wall. In some embodiments, the bonding cap is formed from a metal material. According to some embodiments, the bonding cap forms an interconnect to the electronic device. In some embodiments, the structure material is a polymer. In some embodiments, the polymer is photosensitive. In some embodiments, the sleeve is formed from the structure material. In some embodiments, the collar and sleeve have a curvilinear shape.

In accordance with another aspect, a packaged electronic device comprises a substrate, at least one electronic device disposed on the substrate, an encapsulation structure having a wall that forms a perimeter around the at least one electronic device, and at least one attachment structure having a collar and disposed adjacent the wall of the encapsulation structure, at least a portion of the collar attached to the wall.

In some embodiments, the at least one attachment structure further includes a sleeve formed within the collar such that the sleeve at least partially surrounds an opening in the sleeve. In some embodiments, a wall of the sleeve has an upper surface and a lower surface and the lower surface is attached to the substrate. In some embodiments, a portion of a side surface of the wall of the sleeve is disposed adjacent the wall of the encapsulation structure. In some embodiments, the at least one attachment structure further includes a bonding cap formed within the opening, the opening extending through the sleeve from the upper surface to the lower surface, and the bonding cap extending across the upper surface of the sleeve and onto a portion of an upper surface of the collar. In some embodiments, the at least one attachment structure is disposed adjacent at least one corner of the encapsulation structure. In some embodiments, the at least one attachment structure is disposed at multiple locations adjacent the wall of the encapsulation structure.

In accordance with another aspect, a method of packaging an electronic device is provided. The method comprises depositing a layer of temporary bonding material onto a surface of a first substrate, depositing a layer of structure material onto the temporary bonding material, masking at least a portion of the layer of structure material to define an unmasked portion and a masked portion of the structure material, the unmasked portion of the structure material defining a wall of an enclosure configured to surround the electronic device, performing at least a partial cure of the unmasked portion of the layer of structure material, developing the masked portion of the layer of structure material, attaching a second substrate to a surface of the wall of the enclosure, separating the first substrate from the second substrate, and depositing a layer of metal within a plurality of openings disposed within the wall of the disclosure.

In some embodiments, depositing the layer of metal includes depositing the layer of metal onto at least a portion of an upper surface of the wall of the encapsulation structure.

In accordance with another aspect, a packaged electronic device is provided. The packaged electronic device comprises a substrate, at least one electronic device disposed on the substrate, an encapsulation structure having a wall disposed on the substrate that forms a perimeter around the at least one electronic device, the wall having a plurality of openings disposed therein, and a bonding cap formed within the plurality of openings.

According to some embodiments, material of the bonding cap extends onto an upper surface of the wall. In some embodiments, the plurality of openings are disposed equidistant between two edges of the wall. In some embodiments, at least three openings of the plurality of openings are disposed equidistant from one another. In some embodiments, a sidewall of the encapsulation structure includes a plurality of openings disposed equidistant from one another.

In accordance with another aspect, a method of forming an encapsulation structure for an electronic device is provided. The method comprises depositing a layer of temporary bonding material onto a first substrate, depositing a layer of structure material onto the temporary bonding material, masking at least a portion of the layer of structure material to define an unmasked portion and a masked portion of the structure material, the unmasked portion of the structure material defining at least a portion of an enclosure configured to surround the electronic device and at least one buttress attached to a portion of the enclosure, performing at least a partial cure of the unmasked portion of the layer of structure material, developing the masked portion of the layer of structure material, attaching a second substrate to the unmasked portion of the layer of structure material, and separating the first substrate from the second substrate.

In some embodiments, the at least one buttress extends outwardly from enclosure. In some embodiments, a portion of the at least one buttress is integrated into at least a portion the enclosure. In another embodiment, the portion of the at least one buttress is integrated into at least a portion of a wall of the enclosure.

According to another aspect, an encapsulation structure for use in packaging an electronic device is provided. The encapsulation structure comprises a wall formed from a layer of structure material and configured to surround the electronic device, and at least one buttress formed from the layer of structure material and extending outwardly from the wall.

In some embodiments, the layer of structure material is a first layer of structure material and the encapsulation structure further comprises a lid formed from a second layer of structure material and configured to attach to the wall, and the at least one buttress includes the second layer of structure material and extends outwardly from the lid. In some embodiments, the at least one buttress is at least one of a curvilinear and a rectilinear shape. In some embodiments, the at least one buttress includes a hollow region. According to some embodiments, at least one dimension of the at least one buttress is substantially the same as a dimension of the wall. In some embodiments, a width dimension of the at least one buttress is substantially the same as a width dimension of the wall. According to another embodiment, a dimension of a vertical cross-section of the at least one buttress is substantially the same as a dimension of a vertical cross-section of the wall. In some embodiments, the at least one buttress is formed at a corner portion of the wall. In some embodiments, the at least one buttress is formed at a sidewall portion of the wall.

In accordance with another aspect, a packaging structure for use in packaging an electronic device is provided. The packaging structure comprises a wall formed from a layer of structure material and configured to surround the electronic device, and at least one filler structure formed from the layer of structure material and positioned external to the wall.

In some embodiments, at least one filler structure is formed from a layer of material different than the layer of structure material. In some embodiments, the wall surrounds at least one filler structure. In some embodiments, the at least one filler structure has at least one of a curvilinear and a rectilinear shape. In some embodiments, the at least one filler structure includes a hollow region. In some embodiments, at least one dimension of the at least one filler structure is substantially the same as a dimension of the wall. In some embodiments, a width dimension of the at least one filler structure is substantially the same as a width dimension of the wall. In some embodiments, a dimension of a vertical cross-section of the at least one filler structure is substantially the same as a dimension of a vertical cross-section of the wall.

In accordance with another aspect, the attachment structure, the encapsulation structure, or the packaging structure is disposed in a packaged module. According to another embodiment, the packaged module is disposed in a wireless communications device. According to some embodiments, the packaged module is an electronic device module. In some embodiments, the electronic device module is a radio frequency (RF) device module. In some embodiments, the electronic device module includes an acoustic wave filter.

In accordance with another aspect, a packaged electronic device is provided. The packaged electronic device comprises a substrate, at least one electronic device disposed on the substrate, an encapsulation structure disposed on the substrate and having a wall that forms a perimeter around the at least one electronic device, and at least one support structure formed from a photosensitive polymer and disposed adjacent the wall of the encapsulation structure, the at least one support structure having a configuration that provides at least one of increased adhesion and mechanical strength to the encapsulation structure.

In some embodiments, the at least one support structure is positioned at multiple locations adjacent the wall of the encapsulation structure.

In some embodiments, the at least one support structure has a collar and a portion of the collar is attached to the wall of the encapsulation structure. According to a further embodiment, the at least one support structure further includes a sleeve formed within the collar such that the sleeve at least partially surrounds an opening in the sleeve. In another embodiment, a wall of the sleeve has an upper surface and a lower surface and the lower surface is attached to the substrate. In another embodiment, a portion of a side surface of the wall of the sleeve is disposed adjacent the wall of the encapsulation structure. In another embodiment, at least one dimension of the collar and the sleeve is substantially the same as at least one dimension of the wall of the encapsulation structure. In another embodiment, a width of the collar and the sleeve is substantially the same as a width of the wall. In another embodiment, the at least one attachment structure further includes a bonding cap formed within the opening, the opening extending through the sleeve from the upper surface to the lower surface, and the bonding cap extending across the upper surface of the sleeve and onto a portion of an upper surface of the collar. In some embodiments, the bonding cap is formed from a metal material. In another embodiment, the encapsulation structure further includes a lid attached to at least a portion of the wall, and at least a portion of the collar is attached to the lid. In a further embodiment, the collar forms at least a portion of the lid.

In some embodiments, the at least one support structure is disposed adjacent at least one corner of the encapsulation structure.

In some embodiments, the at least one support structure is formed as a buttress extending outwardly from the wall of the encapsulation structure. In another embodiment, the buttress includes a hollow region at least partially filled with a filler material. In another embodiment, at least one dimension of the buttress is substantially the same as a dimension of the wall, the at least one dimension including at least one of a width and a vertical cross-section. In another embodiment, the wall of the encapsulation structure is formed from a first layer of the photosensitive polymer and the encapsulation structure further comprises a lid formed from a second layer of the photosensitive polymer and configured to attach to the wall, the buttress including the first and the second layers of photosensitive polymer and extending outwardly from the lid.

In some embodiments, the at least one support structure has at least one dimension that is substantially the same as a dimension of the wall, the at least one dimension including at least one of a width and a vertical cross-section. In another embodiment, the at least one support structure is further positioned at a location that is external to the wall of the encapsulation structure. In another embodiment, the at least one support structure is further positioned at a location within an interior of the encapsulation structure.

In some embodiments, the packaged electronic device is disposed in a packaged module of an electronic device.

In accordance with another aspect a method of packaging an electronic device is provided. The method comprises depositing a layer of temporary bonding material onto a first substrate, depositing a layer of photosensitive polymer onto the temporary bonding material, masking at least a portion of the layer of structure material photosensitive polymer to define an unmasked portion and a masked portion of the photosensitive polymer, the unmasked portion of the photosensitive polymer defining at least a portion of an enclosure configured to surround the electronic device and at least a portion of a support structure attached to a portion of the enclosure and having a configuration that provides at least one of increased adhesion and mechanical strength to the encapsulation structure, performing at least a partial cure of the unmasked portion of the layer of photosensitive polymer, developing the masked portion of the layer of photosensitive polymer, attaching a second substrate to the unmasked portion of the layer of photosensitive polymer, and separating the first substrate from the second substrate.

In another embodiment the method further comprises forming at least one opening through the layer of photosensitive polymer and depositing a bonding material into the at least one opening.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1A illustrates a cross-sectional side view of one example of an attachment structure that may be formed adjacent to an encapsulation structure according to one or more aspects of the invention;

FIG. 1B illustrates a cross-sectional side view of another example of an attachment structure that may be formed within an opening of an encapsulation structure in accordance with one or more aspects of the invention;

FIG. 2 is a flow chart illustrating one example of a method according to one or more aspects of the invention;

FIG. 5 illustrates an act in the method of FIG. 2;
FIG. 6 illustrates an act in the method of FIG. 2;
FIG. 7 illustrates an act in the method of FIG. 2;
FIG. 8 illustrates an act in the method of FIG. 2;
FIG. 11 illustrates an act in the method of FIG. 2;
FIG. 12 illustrates an act in the method of FIG. 2;
FIG. 13 illustrates an act in the method of FIG. 2;
FIG. 14 illustrates an act in the method of FIG. 2;
FIG. 17A is a top view of one example of four attachment structures positioned adjacent the corners of an encapsulation structure according to one or more aspects of the invention;
FIG. 17B is a top view of one example of four attachment structures positioned adjacent a sidewall of an encapsulation structure according to one or more aspects of the invention;

FIG. 17C is a side view of one example of an attachment structure positioned adjacent a wall of an encapsulation structure according to one or more aspects of the invention;

FIG. 17E is a side view of another example of a pair of attachment structures positioned adjacent an encapsulation structure according to one or more aspects of the invention;

FIG. 18B is a side view of one attachment structure of FIG. 18A;

FIG. 19A is a top view of an encapsulation structure configured for a bonding material in accordance with one or more aspects of the invention;

FIG. 20A is a top view of one example of a buttress attached to a portion of a wall of an enclosure in accordance with one or more aspects of the invention;

FIG. 20B is a cross-sectional side view of the enclosure and buttress of FIG. 20A taken along line A-A of FIG. 20A;

FIG. 20E is a top view of another example of a buttress attached to a portion of a wall of an enclosure in accordance with one or more aspects of the invention;

FIG. 20F is a cross-sectional side view of the enclosure and buttress of FIG. 20E taken along line A-A of FIG. 20E;

FIG. 21C is a side view of one example of a filler structure in accordance with one or more aspects of the invention;

DETAILED DESCRIPTION

Many different applications, such as WLP, electronic device fabrication, microfluidic systems, and the like, are implemented using any one of a number of different processing techniques, including those typically used in semiconductor fabrication, such as film coating and/or layering, photosensitive film patterning, etching, bonding, etc. For instance, the '233 application discloses a transferable polymer structure that can be created on a preparation substrate and then attached to a device substrate. The transferable structure is thus capable of being created separately and then integrated as a component of the electronic device and packaging.

As noted above, the polymer materials used in the transferable structure may shrink as part of the polymerization or curing process. This shrinking may compromise the ability of the transferable structure to adhere to the substrate. Furthermore, as die sizes decrease, the sizes of the features included in the 3D structures also decrease, meaning there is less surface area available on the transferable structure to adhere to a substrate. Prior attempts to solve the problem have included using a ceramic glass frit to bond the structures to the substrate, which requires a high processing temperature that is often incompatible with many polymer materials and requires line spacing gaps that are larger than the desired dimensions of a device application. Another approach includes using solder as an attachment material, but solder also increases the cost of the manufacturing process, is potentially incompatible with the end use of the device, and is conductive, which may detrimentally affect the functionality of the device. Encapsulation structures having larger sizes and greater surface area may also be used, but these sizes may also be larger than the desired dimensions of many device applications.

Figure 1C:
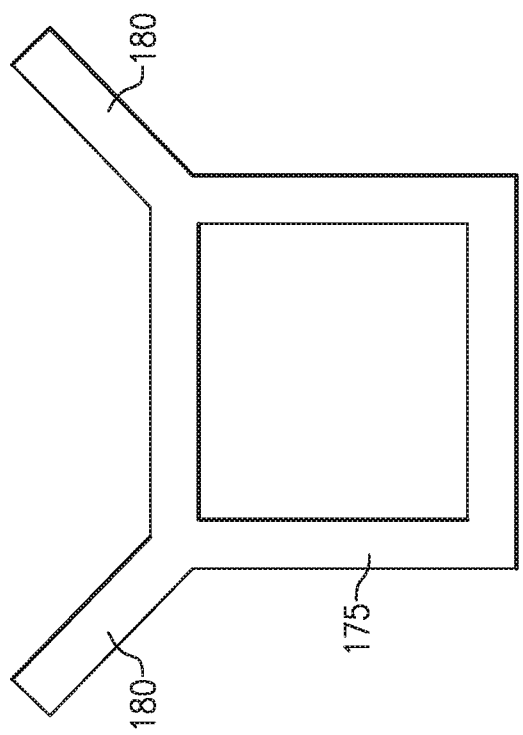
FIG. 1C illustrates a top view of one example of a buttress structure according to one or more aspects of the invention.
Figure 1D:
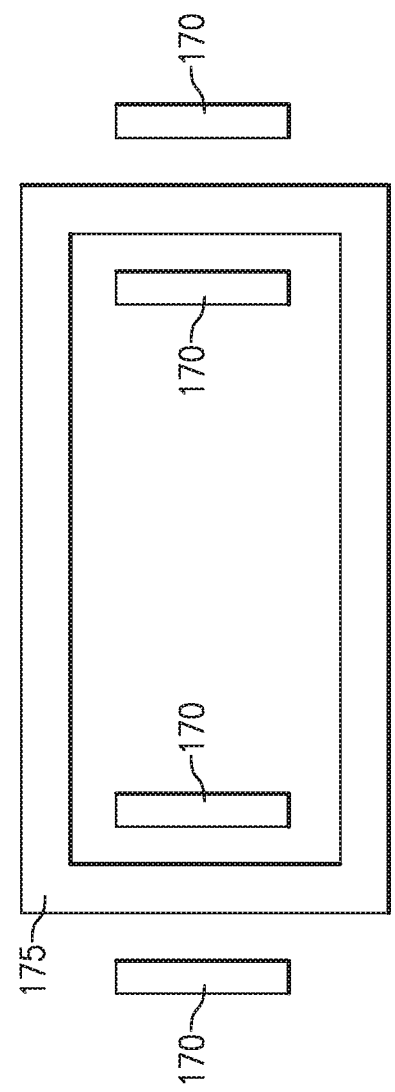
FIG. 1D illustrates a top view of one example of a filler structure according to one or more aspects of the invention.
Figure 17D:
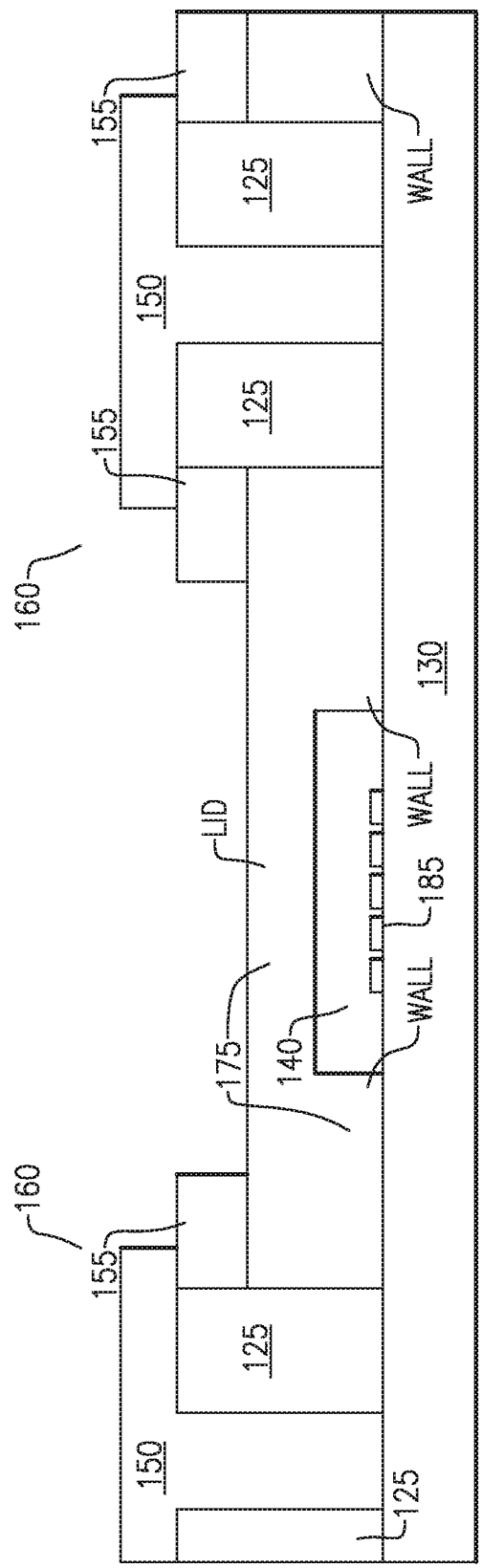
FIG. 17D is a side view of one example of a pair of attachment structures positioned adjacent an encapsulation structure according to one or more aspects of the invention.

Disclosed herein are examples related to a set of support structures for packaging an electronic device. In accordance with one or more embodiments, FIGS. 1A-1D illustrate a set of support structures that are configured to add at least one of mechanical strength to the packaging structure and improve adhesion to the substrate. According to various aspects, the support structures may include any one or more of the attachment structures, buttresses, and filler structures as described herein. For example, FIG. 1A illustrates a cross-sectional side view of example of support structure that is an attachment structure 160 that includes a collar 155 (also referred to herein as a collar structure) and sleeve 125 (also referred to herein as a sleeve structure) that are attached to a device substrate 130. A metal bonding material 150, which may also be referred to herein as a bonding cap, may be deposited within an opening in the sleeve 125 and may also be attached to the device substrate 130. As discussed further below and as shown in FIGS. 17D and 17E, according to some embodiments, the attachment structure 160 may be positioned adjacent an encapsulation structure 175 and the collar 155 may be attached to a portion of the encapsulation structure 175, such as a portion of the lid (FIG. 17E). In some embodiments, the collar 155 may form at least a portion of the lid (FIG. 17D) of the encapsulation structure 175. FIG. 1B illustrates a cross-sectional side view of another example of an attachment structure 160 that is formed within an opening of the encapsulation structure 175 (also referred to herein as an enclosure) that surrounds an electronic device. A metal bonding material 150 may be deposited within the opening of the encapsulation structure that extends to the device substrate 130. FIG. 1C illustrates a top view of one example of a buttress 180 that may be attached at one or more locations to an enclosure 175 that surrounds one or more electronic devices. FIG. 1D illustrates a top view of one example of a filler structure 170 that may be positioned either externally or internally to an encapsulation structure 175. According to some embodiments, the filler structure 170 is constructed from the same material as one or more portions of the enclosure 175, such as the walls and/or lid, although in other embodiments the filler structure 170 may be constructed from a different material than the enclosure 175. For example, the filler structure 170 may be constructed from one or more materials possessing better adhesion to the substrate and/or has greater mechanical strength than the material of the encapsulation structure 175.

The support structures shown in FIGS. 1A-1D may offer robustness against forces such as: external pressures applied during subsequent packaging acts, placement of the packaged devices in a vacuum environment, and shear forces from attachment to a flexing substrate. The support structures may also be sized and/or shaped to be similar in one or more dimensions as the encapsulation structure that surrounds the electronic device or other components included in the package. For instance, the support structures may be sized to have a specified range of contact area length scales for purposes of providing uniformity in height and/or bonding properties, such as force applied during bonding etc. The support structures are capable of being integrated as a component of the electronic device and packaging.

It is to be appreciated that the aspects disclosed herein in accordance with the present invention are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

According to various aspects and embodiments, FIG. 2 illustrates a flow diagram of one example of a method 200 of forming one or more of the support structures (also referred to herein as simply "structures") discussed above in reference to FIGS. 1A-1D. Method 200 is described below in reference to FIGS. 3-16B, and comprises a photolithographic technique for forming support structures that may be integrated into a packaged electronic device. Although FIGS. 3-16B are directed to forming the attachment structure 160 shown in FIG. 1A (having a collar, sleeve, and bonding cap), as discussed herein, one or more of the acts included in method 200 may also be used to create the attachment, buttress, and filler structures shown in FIGS. 1B-1D.

Figure 3:
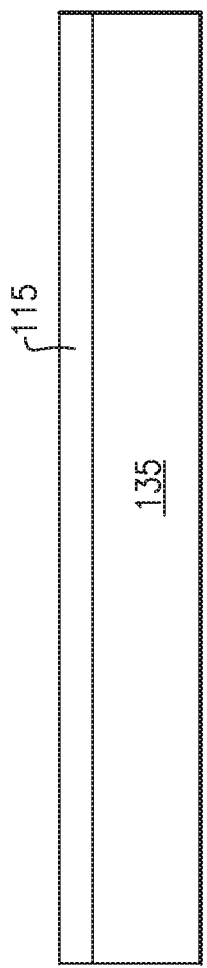
FIG. 3 illustrates an act in the method of FIG. 2.

A first act 202 of method 200 includes treating a surface of a preparation substrate 135 by depositing a layer of temporary bonding material 115 onto a surface of the preparation substrate 135, as shown in FIG. 3. FIG. 3 is a side view of a cross-section of the preparation substrate 135 with the deposited layer of temporary bonding material 115 deposited on a surface of the preparation substrate 135. The temporary bonding material 115 allows for relative ease in the separation or removal of the preparation substrate 135 once the structure material 120 has been transferred to the device substrate 130. Non-limiting examples of temporary bonding materials include polyvinyl alcohol (PVA), Omnicoat™ (commercially available from MicroChem Corp.), polymethylglutarimide (PMGI), Wafer BOND® HT-10.10 (commercially available from Brewer Science, Inc. Rolla, Mo.), and other low surface energy organic materials. According to one embodiment, the temporary bonding material is PVA. According to some embodiments, the temporary bonding material 115 may be a halocarbon, such as tetrafluoromethane ($CF_4$) or sulfur hexafluoride ($SF_6$). In accordance with certain embodiments, the temporary bonding material 115 may be a material that is capable of being dissolved by selected solvents. The temporary bonding material 115 may be deposited using a spin-coat or spray-coat technique, and depending on the application, the thickness may be in a range of about 2000 Angstroms to several microns. According to at least one embodiment, the surface of the preparation substrate 135 is cleaned prior to deposition of the temporary bonding material 115. For instance, the preparation substrate 135 may be cleaned using a Standard Clean 1 (SC1) cleaning solution (i.e., a wet chemical clean), rinsed with water, and then dried, as readily understood by those skilled in the art.

The preparation substrate 135 may be constructed from any one of a number of different materials, including silicon (Si) or glass, and in certain instances may be made of a piezoelectric single crystal material such as, for example, sapphire, lithium tantalite, lithium niobate, quartz crystal, and the like. Other non-limiting examples of suitable preparation substrate materials include glass, zirconium dioxide ($ZrO_2$), zinc oxide (ZiO), and $Al_2O_3$. In certain instances, the preparation substrate 135 may be made from the same material as the device substrate 130. According to some embodiments, the preparation substrate 135 may be constructed from a material that is transparent to UV light. Non-limiting examples of UV transparent materials include silicon carbide (SiC), sapphire, silicon nitride (SiN), and quartz.

According to one or more embodiments, the preparation substrate 135 is a wafer, as understood by those skilled in the art, and may also be referred to herein as a "carrier wafer." According to certain aspects, the preparation substrate 135 may be sized and shaped to be approximately the same size and shape as a device substrate 130, although in certain instances the preparation substrate 135 may be thicker or otherwise more mechanically robust than the device substrate 130. The preparation substrate 135 may take on any shape or size that is suitable for a particular application. For instance, the preparation substrate 135 may be a square or circular shape and may be sized to be smaller or larger than the device substrate 130.

The photolithographic method described herein may also be used to form the enclosure or encapsulation structure that surrounds one or more electronic devices, as described in the '233 application. For example, as discussed in the '233 application, structure material 120 may be used to form the "walls" and "lid" of an enclosure that surrounds electronic devices disposed on a surface of the device substrate. According to some embodiments, the wall and lid structures may be constructed together on the preparation substrate 135 and then transferred to the device substrate 130. According to some embodiments, the electronic device positioned within the encapsulation structure may include or be part of a larger system, such as a wireless device, as discussed further below. Non-limiting examples of electronic devices include MEMS or acoustic wave devices, such as surface acoustic wave (SAW) filters or bulk acoustic wave (BAW) filters, or other similar acoustic wave components. For example, interdigitated transducer (IDT) electrodes of a SAW filter may be disposed on the device substrate within the enclosure. According to some embodiments, one or more of the support structures disclosed herein may be transferred to a device substrate 130 that already has one or more portions of an enclosure or encapsulation structure disposed on its surface. According to other embodiments, one or more of the support structures or portions of the support structures disclosed herein are formed at the same time as the enclosure or encapsulation structure and are transferred at the same time to a device substrate.

Figure 4:
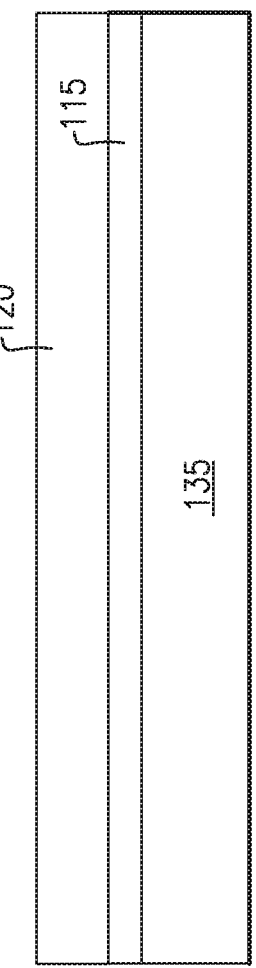
FIG. 4 illustrates an act in the method of FIG. 2.

Returning to FIG. 2, at act 204, a layer of structure material 120 is deposited onto the preparation substrate 135. FIG. 4 illustrates a side view of a cross-section of the layer of structure material 120 disposed directly onto the upper surface of the temporary bonding material 115. According to certain aspects, the layer of structure material 120 may be deposited using spin-coat or spray-on techniques. As used herein, the term "structure material" may be used to refer to one or more materials that are used to form features that may be implemented into electronic devices or into packaged electronic devices. For instance, the structure material 120 may be configured to form one or more of the support structures or portions of the support structures (e.g., 160, 170, and 180) shown in FIGS. 1A-1D. As explained herein, the disclosed support structures may be used to enhance the structural and adhesive integrity of the enclosure that encapsulates the electronic devices disposed on the device substrate.

In accordance with various embodiments, the layer of structure material 120 may include one or more polymer materials. In some embodiments, the polymer material may be a polyimide material, such as polyimide resin. According to one embodiment, the polymer may be photosensitive such that when the material is exposed to light, such as ultraviolet (UV) light, the photosensitive material reacts and polymerizes. In certain instances, the UV light causes crosslinking between polymer chains that results in forming a stable polymeric network, thereby hardening the material. Non-limiting examples of photosensitive materials include photosensitive epoxies, polyimide, and epoxy-based photoresist materials, such as B-stage polymers. Some examples of these materials include SU-8 photoresist (commercially available from MicroChem Corp.), benzocyclobutene (BCB), and mr-I 9000 (commercially available form Micro Resist Technology Gmbh). In some embodiments, the thickness of the structure material is from about 3 microns to about 5 microns, although other thicknesses are within the scope of this disclosure. As will be understood by those of skill in the art, the thickness of the structure material may depend on the desired application, i.e., how thick or thin the desired features are to be.

The structure material 120 is masked at act 206 to create unmasked and masked portions of the structure material 120. According to some embodiments, a masking material 145, such as a photolithographic mask (also referred to herein as a photomask) is used to perform this act, as shown in FIG. 5. For example, FIG. 5 illustrates a view of a cross-section of a photolithographic mask 145 with a pattern that corresponds to the unmasked and masked portions of the underlying structure material 120. The photolithographic mask 145 may be constructed from a solid material, such as glass, quartz, or fused silica that is coated with an opaque film (e.g., chrome), into which the desired pattern is etched. Thus, the "masked" portions of the photolithographic mask 145 include light-blocking material (such as chrome) and the "unmasked" portions allow light to pass through to the underlying layer of material.

In act 208, and as illustrated in FIG. 6, an at least partial cure is performed on the layer of structure material 120. According to some embodiments, the at least partial cure may be performed by exposing the layer of structure material to a source of light, such as UV light. The light may be directed through the photomask 145, thereby causing the exposed (i.e., "unmasked") portions of the structure material 120 to at least partially cure or polymerize. The unexposed (i.e., "masked") portions of the structure material 120 do not polymerize since the photomask 145 functions to reflect (or absorb, depending on the material) the light. In accordance with some embodiments, and as shown in FIG. 6 (with the photomask 145) and FIG. 7 (with the photomask removed), regions of the unexposed portions of the structure material 120b may correspond to one or more "openings" in the structure material 120, such as the examples shown in FIGS. 1A and 1B that are filled with bonding material 150 (discussed below with reference to act 218).

According to some embodiments, the at least partial cure may be accomplished by exposing the structure material 120 to a source of light, such as a source of UV light, for a predetermined amount of time. In accordance with some embodiments, the structure material 120 may be at least partially cured according to a cure schedule provided by the material manufacturer. In certain instances, a partial cure is performed and then a full cure is done during later processing. For instance, once the receiving substrate 130 is attached, a full cure may be performed. A full cure may function to fully polymerize and harden the structure material 120. Partial curing may aid in attaching one or more additional layers of structure material. For example, a partial cure may be performed for each layer of structure material. A partial cure may also aid in attaching the structure material to the device substrate 130. Once attached, a full cure may be performed. According to some embodiments, the structure material 120 may be partially cured at the exposure act 208 and/or a later act prior to bonding. In certain instances, a full curing process may be performed after the structure material 120 is transferred to the device substrate 130.

According to one or more embodiments, the structure material 120 may be treated before or after exposure to light so as to render it capable of bonding, such as by performing a soft-cure step before bonding. In some embodiments, the layer of structure material 120 may be soft baked prior to exposure to light. For example, certain structure materials, such as photoresist, may be soft baked prior to exposure, and then after exposure, undergo a post exposure bake (PEB). Once a develop step is performed (e.g., act 210 in FIG. 2), the photoresist may undergo a hard bake, although according to some embodiments a hard bake is not performed after the develop step. In some embodiments, a shortened or half cure is performed prior to bonding. For instance, SU-8 may be soft baked prior to exposure at a temperature of 95° C. for a time period that depends on the thickness and the type of SU-8 material. After being exposed, a shortened or half cure of the photoresist may be performed prior to bonding. In some embodiments, a PEB process may be performed prior to the develop step and prior to bonding. For instance, SU-8 material may undergo a PEB process at temperatures of about 65° C. and/or about 95° C. for a time period that depends on the thickness and type of SU-8 material (e.g., from 1-5 minutes). According to some embodiments, the temperature and/or time may be reduced for the soft bake and/or PEB (as compared to the times and temperatures recommended by the material manufacturer). Soft bake and PEB may also be used in instances where multiple layers of polymer are formed. For example, a first layer of polymer structure material may be partially cured, and then a second layer of polymer structure material may be deposited on top of the first layer. Once transferred, both layers may be hardened by performing a PEB and optionally a hard bake process. According to embodiments where a hard bake is performed, the hard bake may be performed at a temperature in a range of about 150° C. to about 250° C. for up to 30 minutes (depending on the thickness and the type of photoresist).

The photolithographic processes discussed herein for forming structures references a type of photosensitive material that polymerizes or otherwise reacts with light to form a hardened layer. As will be appreciated by those of skill in the art, other types of photosensitive material may be used as the structure material, such as materials that actually photo-solubilize when exposed to light. Thus, exposed portions of this type of material are removed, and the unexposed portions form the structures that are then transferred to the device substrate. According to this type of embodiment, the photomask that is used reverses the unmasked and masked portions of the photomask used in the examples discussed herein. Thus, the portions exposed to light are developed or otherwise removed at act 210, and additional acts may be performed to render this type of material suitable for transfer or later processing. For instance, an additional curing act may need to be performed, such that the structure material is exposed to heat and/or light of a different wavelength(s).

Figure 9:
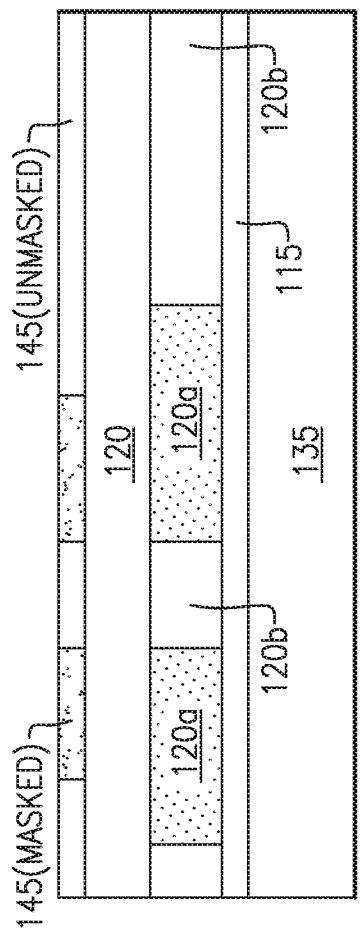
FIG. 9 illustrates an act in the method of FIG. 2.
Figure 10:
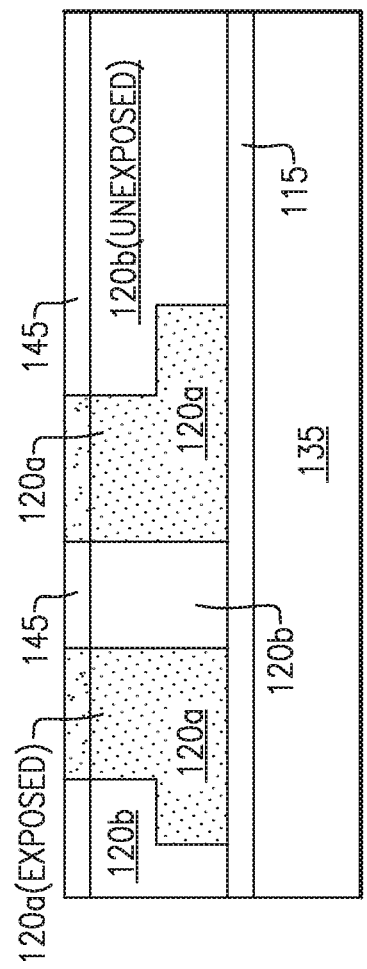
FIG. 10 illustrates an act in the method of FIG. 2.

As indicated in FIG. 2, the deposition 204, masking 206, and at least partial cure 208 acts may be repeated to add additional layers of structure material 120. For instance, as shown in FIG. 8, an additional, second layer of structure material 120 may be spin-coated or otherwise deposited onto the existing first layer of exposed (120a) and unexposed (120b) portions of the first layer of structure material as shown in FIGS. 7 and 8. According to this example, a first mask is configured to construct a first layer of structure material 120 that forms a collar 155 and an upper portion of the sleeve 125 of the attachment structure shown in FIG. 1A ($1^{st}$ layer), and a second mask is configured to construct a second layer of structure material 120 that forms a lower portion of the sleeve 125 of the attachment structure of FIG. 1A ($2^{nd}$ layer). Thus, the second photomask 145 is positioned over the second layer of structure material 120 and has unmasked portions corresponding to the lower portion of the sleeve 125, as shown in FIG. 9 according to act 206. At act 208, the second layer of structure material 120 is at least partially cured, for example, by exposing the second layer to a source of light directed through the photomask 145, which results in unexposed (120b) and exposed (120a) portions of the second layer of structure material, as shown in FIG. 10 (with the photomask 145 in place) where the exposed portions of the second layer of structure material 120a correspond to the lower portion of the sleeve 125 (once attached to the device substrate 130).

The unexposed portions of structure material 120b remain unreacted and may be developed or otherwise removed in act 210 using any one of a number of different removal techniques, such as by exposing the structure material 120 to a solvent, which results in the collar 155 and sleeve 125 structures shown in FIG. 11. An opening 110 in the sleeve 125 that extends through the exposed structure material 120a that forms the sleeve 125 is also formed, which may be later filled with bonding material 150. The at least partially polymerized (exposed) portions of the structure material 120a corresponding to the unmasked regions of the photomask 145 are resistant to the solvent, and therefore only the masked portions 120b are removed. In this instance, and as indicated in FIG. 11, the unexposed portions of both the first layer and the second layer of unexposed structure material 120b are developed or otherwise removed in act 210. According to one embodiment, portions of the unreacted structure material may be developed or otherwise removed in act 210 using one or more organic solvents, such as an SU-8 developer material (commercially available from MicroChem Corp.) or propylene glycol methyl ether acetate (PGMEA), in instances where SU-8 is used as the structure material 120.

As mentioned above and as shown in FIG. 2, additional layers of structure material 120 may be added in a repetitive cycle until a desired structure is formed that may then be transferred from the preparation substrate 135 to the device substrate 130. For instance, the attachment structure of FIG. 1A includes two layers of structure material, where the first layer is masked to form the collar 155 and upper portion of the sleeve 125 and the second layer is masked to form the lower portion of the sleeve 125. Other configurations of attachment structures constructed from one or more layers of structure material are also within the scope of this disclosure.

Referring again to FIG. 2, once the develop act 210 is performed and the desired structure has been created, the device substrate 130 may be attached to at least a portion of the exposed structure material 120a (also referred to hereafter as simply 120) at act 212. For instance, the sleeve structure 125 of the attachment structure shown in FIG. 1A may be aligned to features on the device substrate 130. In some embodiments, the sleeve structure 125 may be aligned with an encapsulation structure disposed on the device substrate 130, where the encapsulation structure forms a perimeter around an electronic device that is also disposed on the device substrate 130. Once aligned, the device substrate 130 may be bonded to the structure material 120.

In accordance with various aspects, the device substrate 130 may be a piezoelectric substrate, such as lithium tantalite or sapphire. According to some embodiments, the electronic device(s) 185 may be interdigital transducer (IDT) electrodes of a SAW filter, although other forms of acoustic wave devices or MEMS devices are also within the scope of this disclosure.

Referring to FIG. 12, the device substrate 130 may be attached or otherwise bonded to the structure material 120 formed on the preparation substrate 135 at act 212. The attachment process may occur at an elevated temperature under pressure for a predetermined length of time. The temperature and time used during bonding may depend on the type of materials used and the type of electronic device being packaged. For instance, when SU-8 is used as the structure material, bonding may be performed at a temperature from about 150° C. to about 300° C. and a pressure of from about 0.5 MPa to about 2 MPa for a time duration of from about 5 minutes to about 45 minutes. According to some embodiments, the bonding may be performed under vacuum conditions. In some embodiments, additional pressure does not need to be applied during the bonding process. In certain instances, the structure material 120 may undergo a full cure after the attachment act 212 is performed.

Although FIG. 12 indicates that portions of the layer of structure material 120 are bonded directly to the device substrate 130, according to some embodiments, one or more portions of the transferred structure may be bonded to features or structures already disposed on the device substrate 130, such as bonding or sealing structures, previously transferred structures, or other features that contribute to the functionality of the package and/or electronic device disposed on the device substrate 130. One or more of these features may require processing that is not conducive to the layer of structure material 120 (or vice versa), and therefore it may be advantageous to create the structure material 120 on a separate substrate and then later transfer the structure material 120 onto these existing features or structures.

At act 214, the preparation substrate 135 may be separated from the device substrate 130. In some embodiments, the preparation substrate 135 may be removed; thereby leaving the layer of structure material 120 attached to the device substrate 130, which may then be inverted, as illustrated in FIG. 13. For instance, FIG. 13 shows a side view of a cross-section of the collar 155 and sleeve 125 formed from the structure material 120a that form structural components of an attachment structure according to one or more embodiments. The temporary bonding material 115 may be removed using any one of a number of different removal techniques, such as by exposing or otherwise contacting the temporary bonding material 115 with a release agent, such as an inorganic or organic solvent, and/or through a thermal process such as by exposing the temporary bonding material 115 to heat. According to some embodiments, a developer material, including developer products sold by MicroChem Corp. ("MCC"), such as MCC 101 may be used as a release agent. According to some embodiments, the release agent may be an inorganic solvent, such as water. For example, PVA (when used as a temporary bonding material) may be dissolved in water. The release agent may also be one that is recommended by the manufacturer of the temporary bonding material 115. For instance, product information published by the manufacturer of the temporary bonding material 115 may include a list of one or more suitable release agents that may be used for dissolving or otherwise removing the temporary bonding material. According to some embodiments, a "dry" transfer is performed, meaning that the preparation substrate 135 is removed without the use of any liquids such as liquid bonding materials and/or solvents.

Although not explicitly shown in method 200 of FIG. 2, according to some embodiments, the preparation substrate 135 may be recycled and reused after it has been removed from the device substrate 130. Thus, the preparation substrate 135 may be used over and over again in multiple processes.

In act 216, and as shown in FIG. 14, the device substrate 130 is masked with a masking material 145. In the example shown in FIG. 14, the masking material 145 is configured to create a bonding cap from bonding material 150 (e.g., see FIG. 15), and in this instance the mask 145 has "open" regions that correspond with the opening 110 in the sleeve 125, an upper surface of the sleeve 125, and a portion of the upper surface of the collar 155. Masking in act 216 may be configured for metal deposition (act 218) and may be performed using any one of a number of different techniques. For instance, a layer of photoresist may be deposited and patterned to function as the mask 145 and form the open regions that correspond to the bonding cap. According to other embodiments, the mask 145 may be a stencil, otherwise referred to herein as a shadow mask, or other screen printing technique. In this instance, the shadow mask may be a planar material, such as a thin metal plate, with a predetermined pattern of one or more openings that correspond to the bonding cap.

Figure 15:
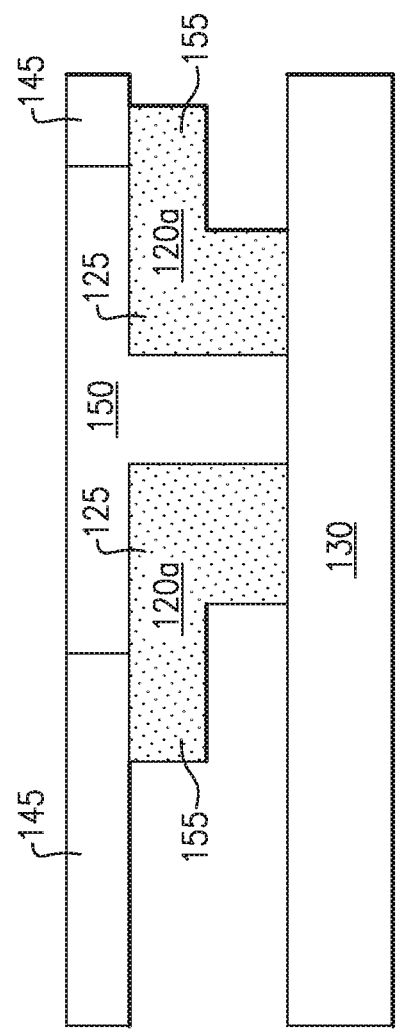
FIG. 15 illustrates an act in the method of FIG. 2.

In act 218, and as illustrated in FIG. 15, a bonding material 150 is deposited into the opening 110 and upper surface of the sleeve 125, and extends onto a portion of the upper surface of the collar 155. In accordance with some embodiments, the bonding material 150 is a metal, non-limiting examples of which include copper (Cu), titanium (Ti), tungsten (W), gold (Au), aluminum (Al), or a combination of one or more metals. The bonding material 150 may be deposited using any one of a number of different deposition techniques, such as by chemical vapor deposition (CVD) or physical vapor deposition (PVD) methods such as sputtering or evaporation, or by electroplating.

Although not explicitly shown, according to some embodiments, the bonding material 150 may be formed over an adhesion layer. For instance, a layer of Ti, TiW, or Cr may be deposited on the structure material 120a, such as the upper surface of the sleeve 125 and the upper surface of the preparation substrate 130 within the opening 110, prior to deposition of a layer of metal material. For example, the bonding material 150 may includes a TiW/Au stack where TiW is deposited as an adhesion or diffusion barrier layer, and Au is deposited on top of the TiW. The method of deposition for the bonding material 150 may be dependent upon the types of materials used and/or the dimensions of the features, such as the aspect ratio (i.e., length to height) of the bonding cap 150. For instance, bonding caps with lower aspect ratios may be formed using plating or PVD techniques, such as sputtering, whereas it may be more difficult to form bonding caps with higher aspect ratios using sputtering techniques. According to various aspects, a bonding cap 150 with a lower aspect ratio may be stronger than a bonding cap 150 with a higher aspect ratio since it has more surface area for the adhesion layer to anchor to. According to some embodiments, the bonding material 150 may be deposited by physical vapor deposition and may be patterned using standard lithographic and etching techniques. According to other embodiments, the bonding material 150 may be deposited by electroplating. A metal seed layer (not shown) may be formed over the adhesion layer as previously described prior to electroplating the bonding material. The metal seed layer may be deposited using PVD techniques. According to some embodiments, the metal seed layer may include or consist of copper (Cu) or TiW—Au alloy.

The bonding cap 150 may be sized and dimensioned to provide structural integrity to the package. According to some embodiments, the "head" of the bonding cap may be sized to extend slightly beyond the sleeve 125, although in other embodiments, it may extend to the edge of the sleeve or within the dimensions of the sleeve. The thickness of the "head" may also vary according to the width of the head, the types of materials used, and the desired aspect ratio of the bonding cap 150. For instance, bonding caps with a wider "head" may include a thinner thickness (height) to the head, and bonding caps having a smaller width to the "head" may require thicker heights. In accordance with at least one embodiment, the diameter of the "head" of the bonding cap 150 may be about twice that of the depth of the bonding cap, giving the bonding cap 150 an aspect ratio with a value of 2:1. As will be appreciated, other dimensions and aspect ratios for the bonding cap are within the scope of this disclosure. According to some embodiments, the head of the bonding cap 150 may have a thickness that is a few tens of microns.

According to some embodiments, the bonding cap 150 may comprise one or more planar surfaces. For instance, the upper or top surface of the bonding cap 150 may be planar, as shown in FIG. 15.

After the bonding material 150 is deposited, any photoresist and portions of the metal seed layer remaining on the upper surfaces of the structure material 120a may be removed by, for example, thermal processing, chemical dissolution, and/or wet or dry etching.

Figure 16A:
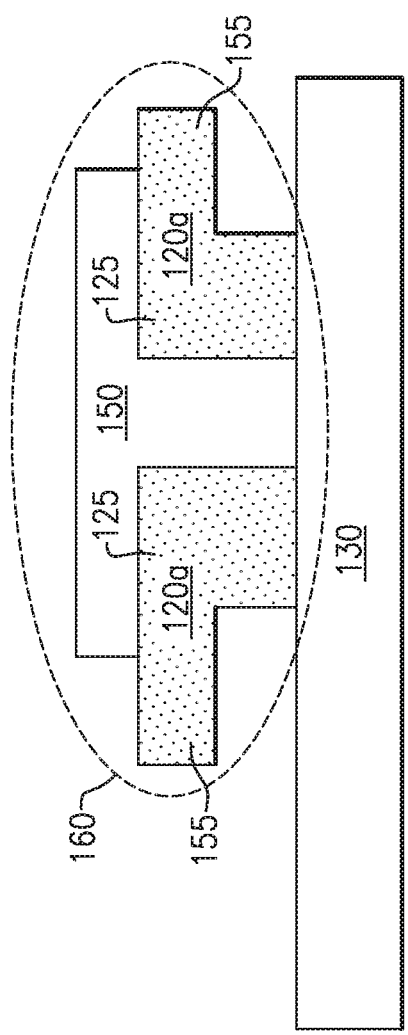
FIG. 16A is a side view of one example of an attachment structure according to one or more aspects of the invention.
Figure 16B:
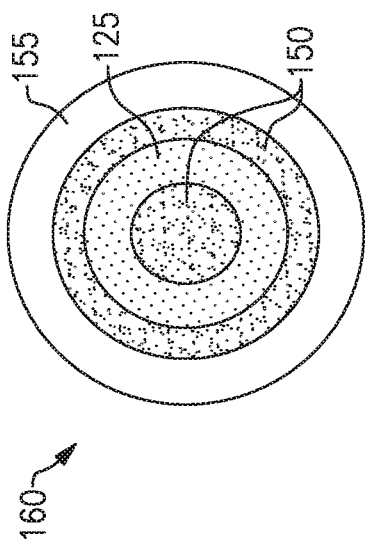
FIG. 16B is a top view of the attachment structure of FIG. 16A.

Once the mask 145 is removed, the resulting attachment structure 160 is shown in FIGS. 16A and 16B. FIG. 16A is a side view of the cross-section of an attachment structure 160 that includes a collar 155 and sleeve 125 formed form one or more layers of structure material 120 and a bonding cap 150 that is formed within an opening that extends through the sleeve 125. The bonding cap 150 shown in FIG. 16B is drawn to be transparent, to reveal the sleeve 125 underneath. The lower surface of the sleeve 125 is attached to the device substrate 130 and the upper surface of the sleeve 125 is planar with an upper surface of the collar 155. In this example, and as shown in the top view shown in FIG. 16B (shown without the underlying device substrate 130), the sleeve 125 and collar 155 are curvilinear in shape, and from an annular structure around the bonding cap 150. However, the sleeve 125 and/or collar 155 may be configured to be other shapes, such as rectilinear in shape. For instance, the sleeve 125 and/or collar 155 may be a square shape. In this particular example, the bonding cap 150 is configured to be formed within the opening in the sleeve 125 such that it extends through the sleeve 125 from the upper surface to the lower surface of the sleeve 125 and to also extend across the upper surface of the sleeve 125 and onto a portion of the upper surface of the collar 155. As mentioned above, in some embodiments the bonding cap 150 may extend to only a portion of the upper surface of the sleeve 125.

According to some embodiments, the attachment structure 160 may be disposed or otherwise placed adjacent to one or more structures disposed on the device substrate 130. According to some embodiments, one or more attachment structures 160 may be positioned adjacent an encapsulation structure that surrounds an electronic device disposed on the device substrate 130. For instance, FIG. 17A is a top view of an embodiment where four attachment structures 160 are each positioned at a corner of an encapsulation structure 175 and FIG. 17B is a top view of an embodiment where four attachment structures are disposed adjacent a sidewall of the encapsulation structure 175. The attachment structure 160 shown in FIGS. 17A and 17B is drawn to be transparent to show the sleeve 125 underneath the bonding cap 150. The examples shown in FIGS. 17A and 17B feature an attachment structure 160 such as that shown in FIGS. 16A and 16B. The attachment structure 160 may be positioned at one or more locations adjacent a wall of the encapsulation structure. FIG. 17C is a side view of a cross-section of the attachment structure 160 of FIGS. 16A and 16B positioned adjacent an encapsulation structure 175 (also referred to herein as an enclosure). One or more electronic devices 185 are disposed on a surface of the substrate 130 and an encapsulation structure 175 includes a wall that forms a perimeter around the electronic devices 185. In this example, a portion of a wall of the sleeve 125 is aligned to be adjacent the wall of the encapsulation structure 175. Further, a portion of the collar 155 of the attachment structure 160 is attached to the encapsulation structure 175. In this instance, a portion of the collar 155 is attached to a portion of the upper surface of the encapsulation structure 175.

In some embodiments, the encapsulation structure 175 may also include a lid that covers the electronic devices 185 and extends across at least a portion of the upper surface of the walls of the encapsulation structure 175. The collar 155 of the attachment structure 160 may therefore be configured to attach to either an upper surface of the wall of the encapsulation structure (in instances where the lid does not extend all the way across the wall) or may be attached to a portion of the lid (in instances where the lid extends across the wall). For example, FIG. 17D illustrates a side view of one embodiment where a portion of the collar 155 is attached to an upper surface of the lid of the encapsulation structure. FIG. 17D also illustrates how two attachment structures 160 may be positioned adjacent an encapsulation structure 175. In some embodiments, the encapsulation structure 175 and one or more portions of the attachment structure 160 may be formed on the preparation substrate and transferred at the same time. For example, the lid and walls of the encapsulation structure 175, as well as the collar 155 and sleeve 125 of the attachment structure 160 may be formed and transferred at the same time. In some embodiments, a first layer of structure material may correspond to the collar 155 as well as a first portion or layer of the sleeve 125, a second layer of structure material may correspond to the lid as well as a second portion or layer of the sleeve 125, and a third layer of structure material may correspond to the wall of the encapsulation structure as well as a third portion or layer of the sleeve 125. In an alternative embodiment, the encapsulation structure 175 and the attachment structure 160 are formed and transferred separately. For instance, the lid and walls of the encapsulation structure 175 may be formed and transferred to the device substrate 130 first, and then the sleeve 125 and collar 155 of the attachment structure 160 may be formed and transferred to the device substrate 130.

According to some embodiments, at least a portion of the sleeve and/or collar of the attachment structure 160 may be integrated into the encapsulation structure 175. FIG. 17E is a side view of an example where the collar 155 is configured to be integrated into the lid of the encapsulation structure 175. The collar 155 may therefore extend outwardly toward the cavity 140 housing the electronic device 185 and form at least a portion of the lid of the encapsulation structure 175. In some embodiments, a first layer of structure material corresponds to the lid of the encapsulation structure 175 as well as the collar 155 and a first portion or layer of the sleeve 125. A second layer of structure material can then be added that corresponds to the walls of the encapsulation structure 175 and a second portion or layer of the sleeve 125.

The attachment structure 160 functions to add structural support to the packaging structure, including the encapsulation structure 175, and to function as a bonding agent and help more firmly "secure" or otherwise adhere the encapsulation structure 175 to the device substrate 130. For instance, the encapsulation structure 175 may be formed from polymer material, such as SU-8, and during the curing process portions of the material may shrink and lift off or otherwise separate from the device substrate 130. The attachment structure 160 therefore includes features that aid in securing structure material 120 that forms the encapsulation structure 175 to the device substrate 130. For instance, the bonding cap 150 adheres to the device substrate 130 more strongly than the structure material of either the encapsulation structure 175 or the sleeve 125, and the collar 155 and sleeve 125 help hold the encapsulation structure 175 in place, especially when deforming stresses are applied. The increased contact area generated by the attachment structure 160 and formed between the lower surface of the sleeve 125 and the device substrate 130 also enhances the strength, i.e., increases adhesion, of the bond. The flared head of the bonding material 150 may also function to provide structural support for the collar 155 and/or sleeve 125.

In accordance with at least one embodiment, uniform dimensions may be used in forming the attachment structures and other components of the device packaging, such as the encapsulation structure 175. This results in enhanced performance and ease in manufacturing the device packaging, such as similar height dimensions, which allows for uniform forces to be applied during bonding steps, and also allows for equal forces at locations in the structure that are bond locations. In one embodiment, at least one dimension of the sleeve 125 and the collar 155 is substantially the same as at least one dimension of the encapsulation structure 175. For instance, FIG. 17C indicates that a width dimension of the sleeve 125 and collar 155 (labeled "A") is substantially the same as a width dimension of the wall of the encapsulation structure 175 (labeled "B"). In some embodiments, the width of the wall and the width of the sleeve 125 and collar 155 may be from about 20 microns to about 50 microns, although other thicknesses are also within the scope of this disclosure. For example, in some embodiments, the wall thickness of the enclosure may be 25 microns or greater.

Figure 18A:
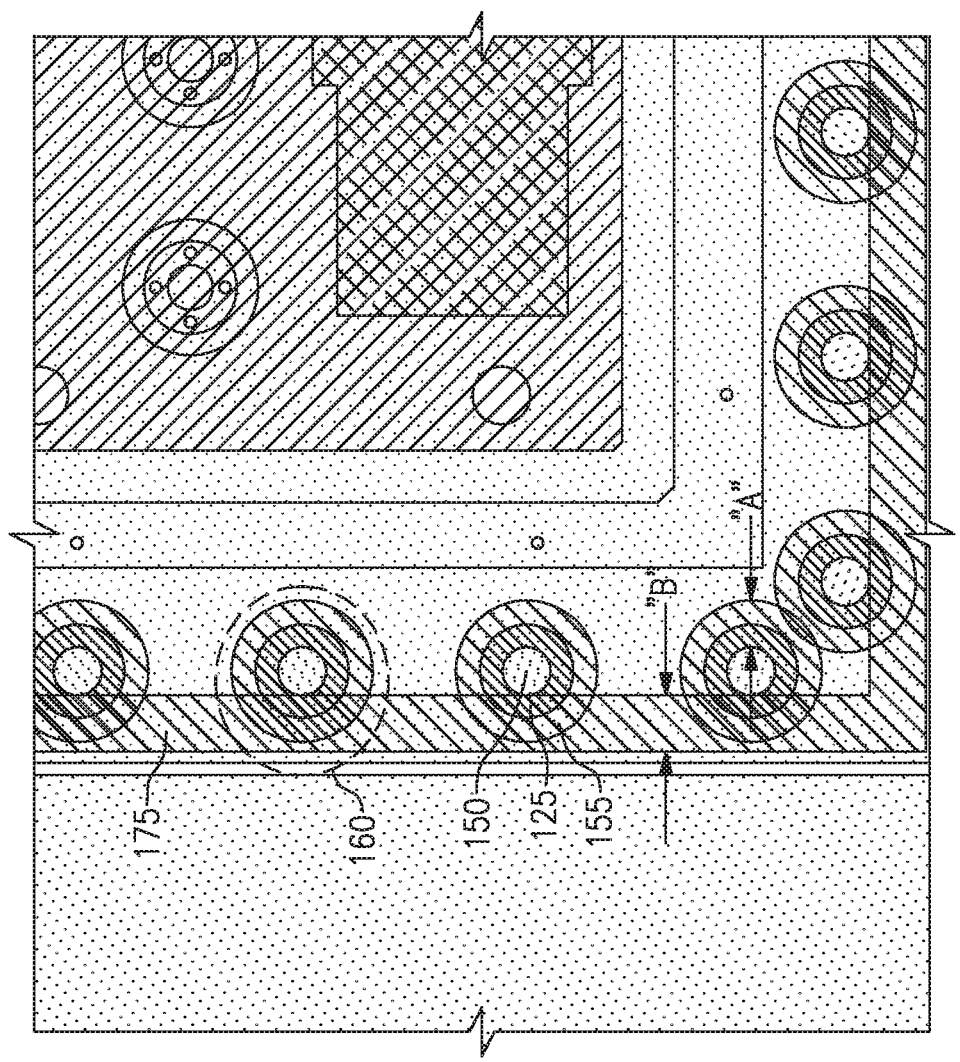
FIG. 18A is a top view of one example of attachment structures positioned adjacent a wall of an encapsulation structure according to one or more aspects of the invention.

According to some embodiments, the attachment structure 160 may be attached at multiple locations around the encapsulation structure 175, as shown in the top view of FIG. 18A. A side view of a cross-section of one attachment structure 160 of FIG. 18A is shown in FIG. 18B. The attachment structure 160 shown in FIG. 18A is drawn to be transparent to show the sleeve 125 underneath the bonding cap 150. According to this embodiment, each attachment structure 160 is positioned within the wall of the encapsulation structure 175, although as shown in FIGS. 17A and 17B, the attachment structure 160 may be positioned outside the wall of the encapsulation structure 175. In the embodiment shown in FIGS. 18A and 18B, a portion of the wall of the sleeve 125 forms a portion of the wall of the encapsulation structure 175. As can be seen more clearly in FIG. 18A, the wall of the encapsulation structure 175 is adjacent the bonding material 150 formed within the opening of the sleeve 125. In this embodiment, the sleeve 125 and collar 155 are configured such that a width dimension of the sleeve 125 and collar 155 (labeled as "A" in FIGS. 18A and 18B) is substantially the same as a width dimension of the wall of the encapsulation structure 175 (labeled as "B" in FIGS. 18A and 18B). According to other embodiments, the collar 155 may also form a portion of the wall of the encapsulation structure 175. The attachment structure 160 shown in FIGS. 18A and 18B functions in a similar way as the attachment structure 160 of FIGS. 16A and 16B. For instance, the collar 155 and sleeve 125 with bonding material 150 through their core aid in adding structural support and bonding integrity to the encapsulation structure 175.

Although not explicitly shown in FIG. 17C or FIG. 18B, the bonding cap 150 of the attachment structure 160 may be configured to form an interconnect to the electronic device 185. For instance, the bonding cap 150 may be used as an interconnect to route signals between one or more layers in the electronic device package. The bonding material 150 may extend to the underlying device substrate 130 (or bonding structures formed thereon). In some embodiments, the bonding material 150 forms the electrical contact between elements of the package, such as the electronic device 185 disposed within the cavity 140, and the outside of the package.

As discussed above, the walls and/or lid of the encapsulation structure 175 may be formed and transferred separately and may be positioned on the device substrate 130 prior to the formation and transfer of the attachment structure 160. In the embodiment shown in FIG. 17C, the wall of the sleeve 125 is positioned immediately adjacent the wall of the encapsulation structure 175, such that they are touching. In other embodiments, a gap may exist between the sleeve 125 and the wall of the encapsulation enclosure 175, and the collar 155 may be attached to the upper surface of the encapsulation structure 175. In the embodiment shown in FIG. 18B, the wall of the sleeve 125 is configured to form a portion of the wall of the encapsulation structure 175, but in other embodiments, the sleeve 125 may be completely integrated into the wall of the encapsulation structure 175. This may include a process whereby at least a portion of the sleeve 125 or at least a portion of the sleeve 125 and collar 155 are formed on the preparation substrate 135 at the same time as the encapsulation structure 175.

According to another embodiment, an attachment structure 160 may be integrated into the encapsulation structure 175. For example, FIG. 19A is a top view of an encapsulation structure 175 that includes one or more openings 165, which are also shown in FIG. 19B, which illustrates a portion of the wall of the encapsulation structure 175 of FIG. 19A. The openings 165 may be formed according to one or more processes. For instance, the openings 165 may be formed using an etch process, such as a dry or wet etch process. This type of processing forms the openings 165 by etching through the structure material 120 that forms the encapsulation structure 175. In some instances, the openings 165 may extend through the wall of the encapsulation structure 175. In instances where the lid extends over the walls of the encapsulation structure 175, the openings 165 may also extend through the lid.

According to another example, one or more of the openings 165 may be formed using a photolithographic process, such as by implementing acts 204-210 of the method 200 discussed above in reference to FIG. 2. The openings 165 would therefore correspond to masked portions of the structure material 120 that are later removed during the develop step 210. In another example, the openings 165 are formed by creating a double-walled encapsulation structure 175 that includes "bridged" regions that extend between the two walls. For instance, two nested walls may form the enclosure or, in the alternative, each side of the enclosure may include a pair of walls, as shown in FIG. 19A. Also as illustrated in FIG. 19A, the pair of walls may be configured to have one or more dimensions that are substantially the same. For instance, the width of the outer wall (labeled "A") may be substantially the same as the width of the inner wall (labeled "B").

Figure 19C:
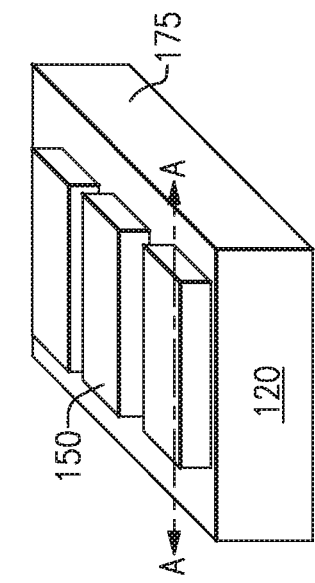
FIG. 19C is a perspective view of the encapsulation structure of FIG. 19B with the addition of bonding material in accordance with one or more aspects of the invention.
Figure 19B:
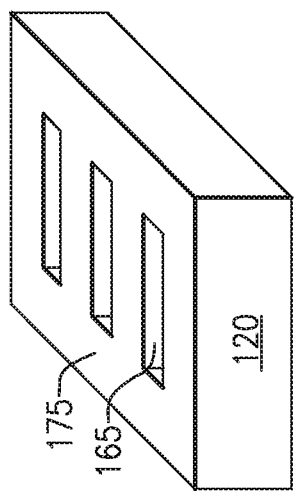
FIG. 19B is a perspective view of a portion of the encapsulation structure of FIG. 19A.
Figure 19D:
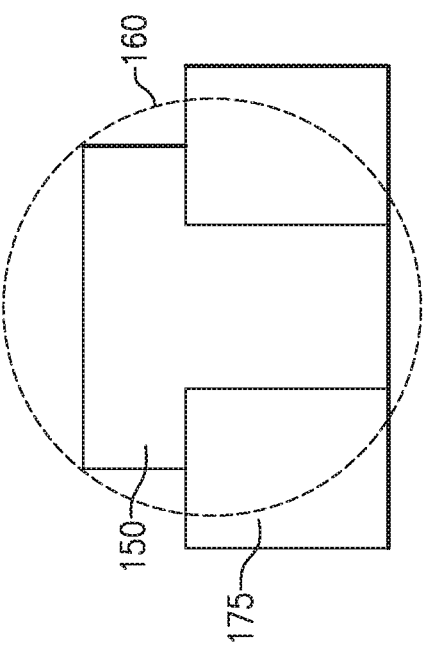
FIG. 19D is a cross-sectional side view of the encapsulation structure and bonding material taken along a vertical cross-section that includes line A-A of FIG. 19C.

In accordance with at least one embodiment, bonding material 150 may be deposited into the one or more openings 165 formed within the encapsulation structure 175, as shown in FIGS. 19C and 19D. For instance, FIG. 19C is a perspective view of the encapsulation structure 175 of FIG. 19B with bonding material 150 deposited within the openings 165, and FIG. 19D is a side view of a cross-section taken along a vertical cross-section that includes line A-A of FIG. 19C. The bonding material 150, otherwise referred to as a bonding cap, may be a metal material that is deposited using any of the methods discussed above in reference to act 218. For instance, metal material may be deposited into the openings 165 using electroplating or evaporation techniques. The bonding material 150 may be deposited such that it extends onto at least a portion of the upper surface of the encapsulation structure 175, as shown in FIGS. 19C and 19D, and therefore forms a "T" shaped structure. Since the material of the bonding cap 150 adheres more strongly to the device substrate 130 than the structure material 120, the bonding cap 150 functions to add strength to the bond between the encapsulation structure 175 and the device substrate 130 and to help hold the encapsulation structure 175 in place.

Although FIGS. 19A-19D feature openings 165 that are rectilinear in shape, other types of shapes are also within the scope of this disclosure. For instance, the openings 165 may be curvilinear, and may form round apertures that extend through the encapsulation structure 175. According to some embodiments, the openings 165 may be disposed equidistant between two edges of the wall. For instance, the "A" and "B" dimension shown in FIG. 19A are substantially the same, and therefore opening 165 is disposed equidistant between the outer (labeled "c") and inner (labeled "d") edges of the wall of the enclosure 175. In some embodiments, at least three openings 165 may be disposed equidistant from one another. For instance, the center of the middle opening 165 labeled in FIG. 19A may be positioned the same distance from the center of the top opening and the center of the bottom opening. Therefore, in some embodiments, a sidewall of the encapsulation structure 175 may include a plurality of openings 165 that are disposed equidistant from one another. Other spacing configurations are also within the scope of this disclosure. For instance, openings 165 may be formed at locations where the polymer structure material 120 is known to shrink or pull away from the substrate, such as at corners.

Figure 20C:
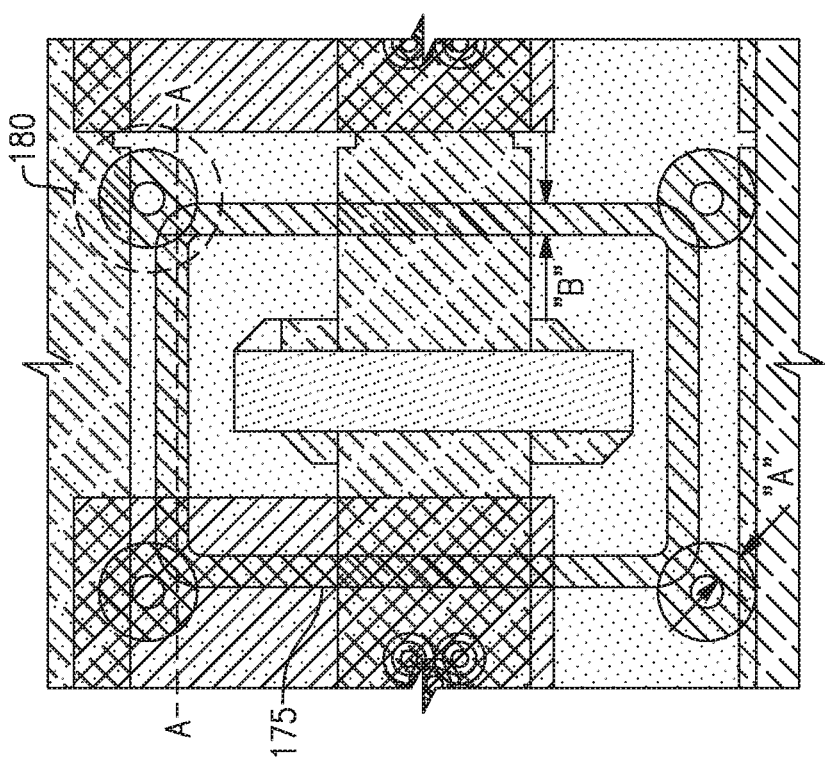
FIG. 20C is a top view of another example of a buttress attached to a portion of a wall of an enclosure in accordance with one or more aspects of the invention.
Figure 20D:
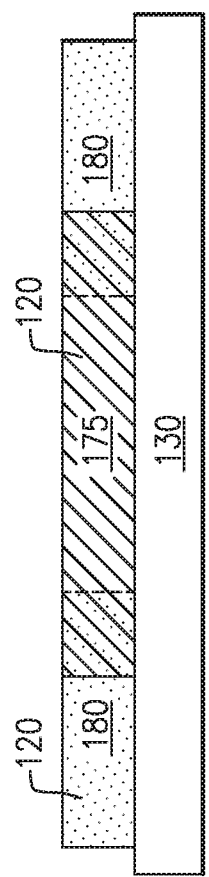
FIG. 20D is a cross-sectional side view of the enclosure and buttress of FIG. 20C taken along line A-A of FIG. 20C.

According to another embodiment, support structures formed as buttresses (or buttress structures) may be added to or otherwise incorporated with the encapsulation structure 175. FIGS. 20A, 20C, and 20E each illustrate a top view of a three examples of an encapsulation structure 175 that includes at least one buttress 180 (also referred to herein as a "buttress structure"). In accordance with one or more embodiments, the buttress 180 extends outwardly from the wall of the encapsulation structure 175. The buttress 180 may be positioned at one or more locations on the encapsulation structure 175. For instance, in the examples shown in FIGS. 20A, 20C, and 20E, the buttress 180 is positioned at each corner of the encapsulation structure 175. According to other examples, the buttresses may be positioned at other locations on the encapsulation structure 175, such as the sidewalls. FIGS. 20B, 20D, and 20F are each a side view of a cross-section taken along line A-A of FIGS. 20A, 20C, and 20E respectively, and each includes a partially transparent view of the encapsulation structure 175. As shown in each of FIGS. 20B, 20D, and 20F, a portion of the buttress 180 may be integrated into at least a portion of the encapsulation structure 175, such as a wall and/or a wall and lid of the encapsulation structure 175. For instance, where a lid of the enclosure 175 extends across the width of the wall of the enclosure, then the buttress 180 may form a portion of the wall and lid.

The buttress 180 may function to alleviate stresses formed within the structure material 120 that forms the encapsulation structure 175. For instance, the structure material 120 may shrink during cure at the corner locations, which in certain cases can lead to delamination from the substrate 130. The buttress 180 can therefore be positioned at the corner locations to help balance the inward forces experienced during cure and thereby reduce the risk of delamination.

In some embodiments, the buttress 180 is formed using a photolithographic process, such as by implementing acts 204-210 of the method 200 discussed above in reference to FIG. 2. The buttress 180 may be formed at the same time as the encapsulation structure 175 and may require one or more layers of structure material 120. For instance, unmasked portions of the structure material 120 may define a wall or lid of the enclosure, as well as at least one buttress that is attached to a portion of the wall or lid. In some instances a first layer of structure material defines the walls of the enclosure 175 and a first layer of the buttress 180, and a second layer of structure material defines the lid of the enclosure 175 and a second layer of the buttress 180.

According to some embodiments, the buttress 180 is at least one of a curvilinear and a rectilinear shape. For instance, FIGS. 20A and 20E both illustrate buttresses 180 with rectilinear shapes. Specifically, FIG. 20A illustrates a buttress 180 having a rectangular shape, and FIG. 20E illustrates a buttress 180 having a "cross" or "plus" or "X" shape. FIG. 20C illustrates a buttress 180 with a curvilinear shape, and in this example is an annular ring. In addition, the buttress 180 may include a hollow region (otherwise referred to herein as a void), such as the hollow "ring" structure shown in FIG. 20C. In this example, the hollow region extends through the buttress 180, but in other embodiments, the hollow region may extend through only a portion of the buttress 180. In some embodiments, the hollow regions may be at least partially filled with a filler material, such as metal or another type of polymer. The filler material may function to enhance the adhesion of the buttress 180 to the device substrate 130, and may therefore be filled with material that adheres more strongly to the device substrate 130 than the material comprising other portions of the buttress. The filler material may also function to enhance the structural integrity of the buttress 180. As will be appreciated, the shapes shown in FIGS. 20A, 20C, and 20E are non-limiting and the buttress may have any one of a number of different shapes, including trapezoids, helixes, triangles, squares, rectangles, ellipses, circles, or combinations of rectilinear and curvilinear shapes. The shape of the buttress 180 may depend on the application, the types of materials, and the geometry and size of the encapsulation structure 175 and may be sized and shaped to perform the function of reducing the risk of delamination or otherwise improve adhesion of the enclosure to the substrate.

The buttress 180 may be configured to have at least one dimension that is substantially the same as a dimension of the encapsulation structure 175. In some embodiments, at least one dimension of the buttress 180 is substantially the same as a dimension of the wall of the encapsulation structure 175. For instance, as shown in FIGS. 20A, 20C, and 20E, a width dimension of the buttress 180 (labeled as "A") is substantially the same as a width dimension of the wall of the encapsulation structure 175 (labeled as "B"). According to some embodiments, a dimension of a vertical cross-section of the buttress 180 is substantially the same as a dimension of a vertical cross-section of the encapsulation structure 175, such as a wall. For instance, a vertical cross-section of the buttress 180 may have a height that is substantially the same as a height dimension of a vertical cross-section of the wall or the wall and lid of the encapsulation structure 175. Configuring the buttress 180 to have a dimension that is substantially the same as the encapsulation structure 170 may provide mechanical uniformity to the bond region, such as a uniform height and uniform compressibility, etc.

Figure 21A:
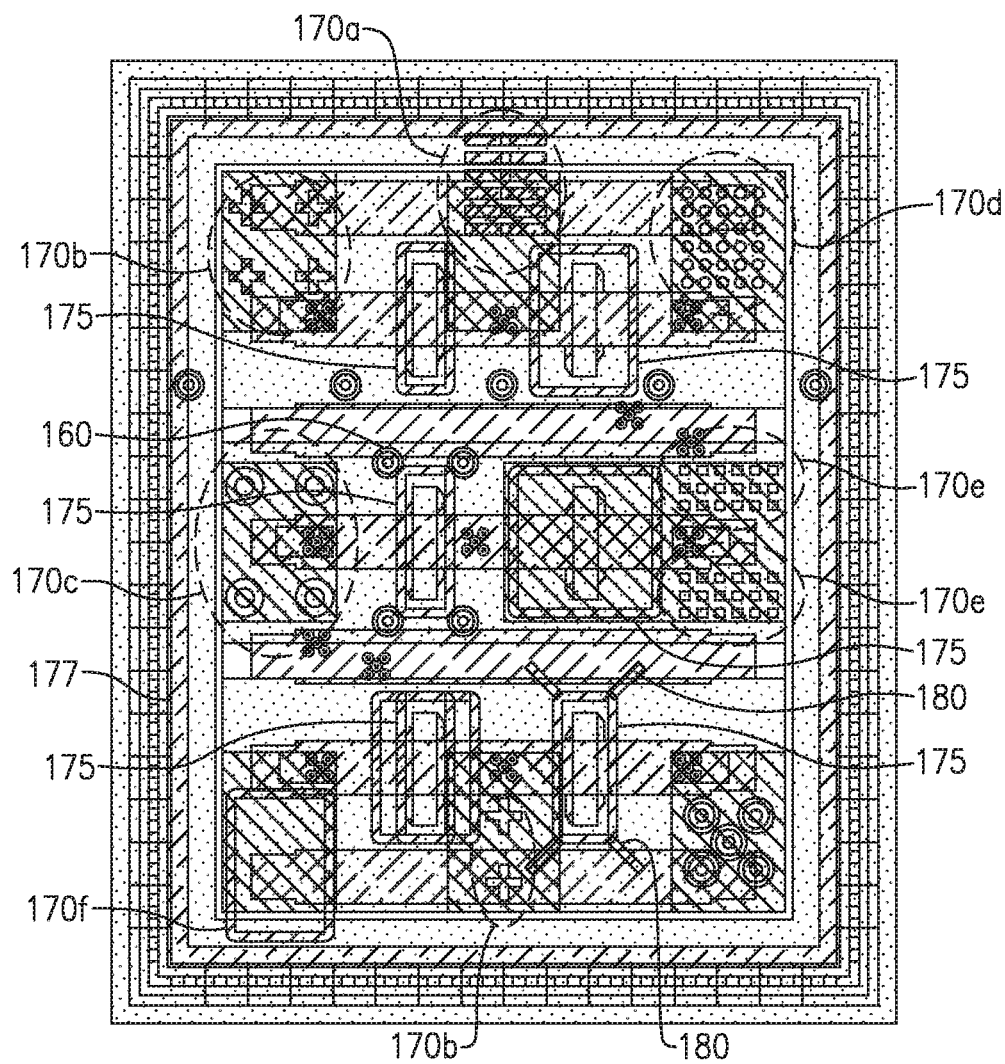
FIG. 21A illustrates a top view of several examples of filler structures in accordance with one or more aspects of the invention.

According to another embodiment, a support structure formed as a filler structure may be added to the device package. FIG. 21A is a top view of a large chip scale package (CSP) structure 177 or module that includes several examples of filler structures 170a-170f that are positioned within the CSP structure 177. The perimeter of the CSP structure 177 may be a wall that is formed from one or more layers of structure material 120, such as a polymer material, as previously described. Although not explicitly shown in FIG. 21A, a "lid" or "roof" may also be formed over the CSP structure 177 that attaches to the walls. The CSP structure 177 may include one or more encapsulation structures 175 that each surround one or more electronic devices. In some embodiments, the lid of the CSP structure 177 may function as the lid of each of these encapsulation structures, and in other embodiments, each encapsulation structure 175 may have a separate lid. In the example shown in FIG. 21A, six separate enclosures or encapsulation structures 175 are disposed within the interior of the module 177. In accordance with some embodiments, at least one filler structure 170 may be positioned external to the wall of encapsulation structure 175. In other embodiments (not illustrated), the filler structure 170 may be positioned within the encapsulation structure 175. FIG. 1D shows an embodiment where filler structures 170 are positioned both internal and external to an encapsulation structure 175. The filler structure 170 may function to provide structural support to the lid or roof of the CSP structure 177 and/or the lid of the encapsulation structure 175 (when positioned within the interior of the encapsulation structure 175).

Figure 21B:
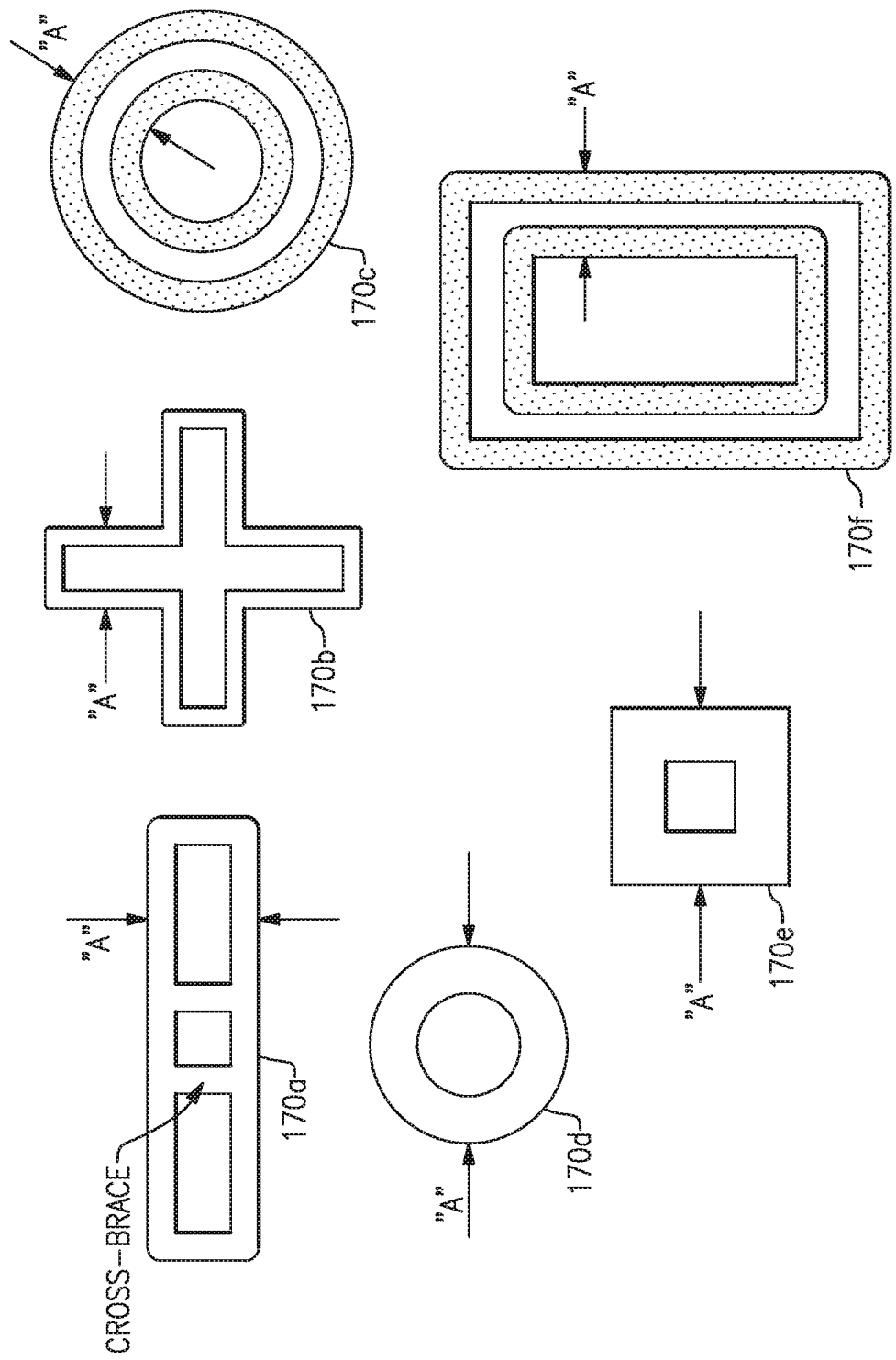
FIG. 21B illustrates top views of each example of the filler structure shown in FIG. 19A.

FIG. 21B is a top view of each example of the filler structures 170a-170f shown in FIG. 21A. The filler structure 170 may be configured to take on any one of a number of different sizes and shapes. In some embodiments, the filler structure 170 may have at least one of a curvilinear and a rectilinear shape. For instance, filler structure 170a of FIG. 21A as shown in FIG. 21B has rectilinear sidewalls with curvilinear corners and includes a single-walled structure with a hollow interior region that includes two cross-braces that extend between the longitudinal portions of the two sidewalls. Filler structure 170b has a rectilinear "cross" shape with a hollow interior. Filler structure 170d has a curvilinear shape with a hollow interior and forms an annular ring, and filler structure 170e has a rectilinear shape having a square shape with a hollow interior. The filler structure 170 may be constructed to have multiple walls, such as the double-walled configurations of filler structure 170c and 170f. Although the filler structures 170 shown in FIG. 21B all include hollow regions, the filler structure 170 may also be formed from solid material, such as the filler structures 170 shown in FIG. 1D. As will be appreciated by those skilled in the art, the shapes and configurations shown in FIGS. 21A and 21B are non-limiting and other shapes and configurations are also within the scope of this disclosure. The filler structure 170 may be of any shape or size appropriate for the proper functionality of the module 177 and to provide additional mechanical strength, as discussed below. The shape and size of the filler structure 170 may depend on the particular application, including the types of device and types of materials used, as well as the geometry of the package.

The filler structure 170 may function to provide structural integrity to the device package. One or more filler structures 170 may be positioned in areas of the package where additional mechanical strength may be desired. For instance, the example shown in FIG. 21A has device enclosures or encapsulation structures 175 distributed and positioned near the interior of the module 177 and has filler structures 170a-170f positioned near the external regions of the module 177, where there may otherwise be "blank" space. As one example, filler structures 170b are positioned in a first corner region of the module 177, filler structure 170d is positioned at a second corner region of the module 177, and filler structure 170f is positioned in a third corner of the module 177. Filler structures 170c and 170e are positioned near the interior and a sidewall of the module 177. The filler structures 170a-170f are positioned external to the enclosures or encapsulation structures 175 and within the module 177 to provide additional strength to the package and to help balance or offset stresses experienced by the package, such as bending or thermal stresses, as well as effects of other structures within the module 177, such as the devices and/or encapsulation structures 175.

According to some embodiments, the filler structure 170 may be configured to have at least one dimension that is substantially the same as a dimension of the encapsulation structure 175. In some embodiments, at least one dimension of the filler structure is substantially the same as a dimension of the wall of the encapsulation structure 175. For instance, in a similar manner as described previously, a width dimension of the filler structure 170 (labeled as "A" in FIG. 21B) is substantially the same as a width dimension of the wall of the encapsulation structure 175. In some instances, the dimension may be a width dimension of one or more "walls" that form the perimeter of the fillers structure 170, such as those shown in FIG. 21B. According to some embodiments, a dimension of a vertical cross-section of the filler structure 170 is substantially the same as a dimension of a vertical cross-section of the encapsulation structure 175, such as a wall. For instance, a vertical cross-section of the filler structure 170 may have a height that is substantially the same as a height dimension of a vertical cross-section of the wall, or the wall and lid of the encapsulation structure 175. The common or uniform dimensionality of the filler structure 170 and other components of the package, such as the encapsulation structure 175 help provide overall strength and uniformity.

In some embodiments, the filler structure 170 may be formed from one or more layers of structure material 120. FIG. 21C is a side view of a cross-section of a device substrate 130 with one or more layers of structure material 120 that form the filler structure. The filler structure 170 may be formed using a photolithographic process, such as by implementing acts 204-210 of method 200 discussed above in reference to FIG. 2. For instance, unmasked portions of the structure material may correspond to the filler structure 170. The filler structure 170 may require one or more layers of structure material 120. According to some embodiments, the filler structure 170 may be prepare separately on the preparation substrate 135 and then transferred to the device substrate 130 either before or after the encapsulation structure 175 has been transferred to the device substrate 130. In certain instances, the filler structure 170 may be prepared and transferred to the device substrate 130 at the same time as the encapsulation structure 175.

Also shown in FIG. 21A are examples of enclosures 175 that include an attachment structure 160 such as the attachment structure 160 discussed above in reference to FIGS. 17A, and 17B, and a buttress 180 as discussed above in reference to FIG. 20A.

Figure 22:
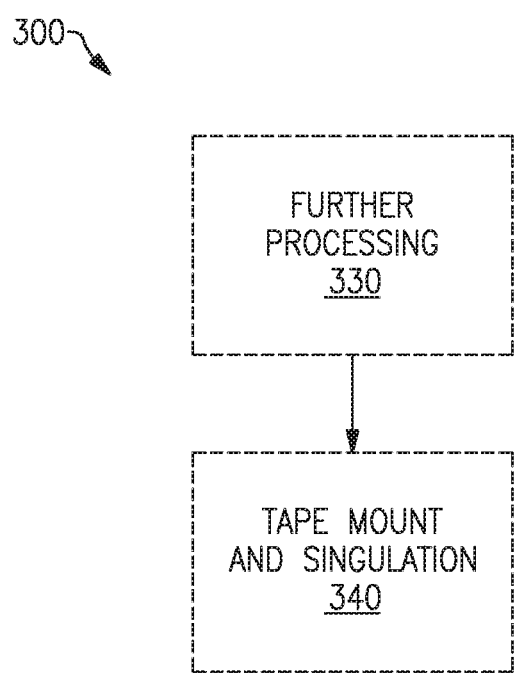
FIG. 22 is a flow chart illustrating one example of additional acts that may be performed in accordance with one or more aspects of the invention.

Acts 330 and 340 of FIG. 22 may optionally be performed using the device substrate 130 with one or more of the support structures disclosed herein. For example, in act 330 further processing may be performed, such as depositing or removing other layers of material that provide functionality to the electronic devices or packaging that houses the devices. According to some embodiments, act 330 may include adding sealing structures to the device package. The sealing devices may aid in sealing the packaged device from external environments outside the package. Act 340 includes tape mounting the packaged devices to an adhesive-coated tape, and then performing singulation using a die cutting process, as recognized by those of skill in the art.

Although method 200 discussed above discloses a photolithographic technique for forming the support structures disclosed herein, other methods of forming these structures is also within the scope of this disclosure. For instance, according to one embodiment, structure material 120 may be deposited directly onto either the preparation substrate 130 and/or the device substrate 135 using an inkjet printing technique. One such example of using this technique to directly deposit onto a preparation substrate 135 may include first depositing a layer of temporary bonding material (as described above in reference to act 202 of method 200) which is followed by depositing structure material 120 in an uncured state by an inkjet printer that has been configured to deposit the structure material 120 into a desired pattern, such as the collar and/or sleeve of the attachment structure 160, the buttress structure 180, the filler structure 170, and/or the walls and lid of the encapsulation structure 175, as described above. Once deposited, the structure material may be at least partially cured and then transferred or otherwise bonded to the device substrate 130.

Figure 23:
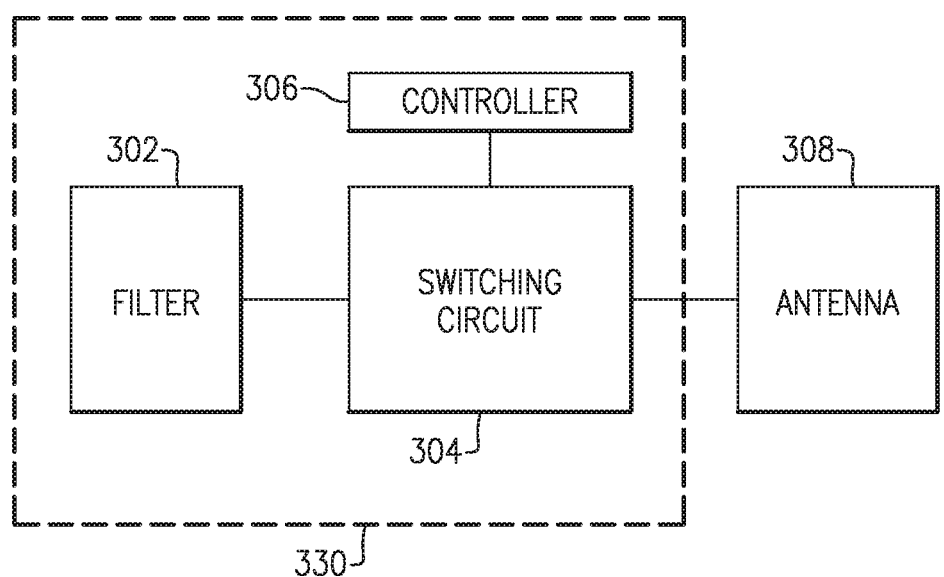
FIG. 23 is a block diagram of one example of a device that can be fabricated according to aspects of the present invention.

Embodiments of the support structures described herein can be included in an electronic device or component and/or can be integrated into a variety of different modules including, for example, a stand-alone module, a front-end module, a module combining the component with an antenna switching network, an impedance matching module, an antenna tuning module, or the like. FIG. 23 is a block diagram of a device 330, such as a wireless device, that can be fabricated according to one or more of the processes described herein. Such a device 330 can include one or more acoustic wave filters 302, such as SAW or BAW filters or other similar acoustic wave components, and can be packaged according to one or more of the embodiments as described herein. The device 330 can also include a switching circuit 304. In some embodiments, control of the switching circuit 304 can be performed or facilitated by a controller 306. The device 330 can also be configured to be in communication with an antenna 308.

Embodiments of the support structures disclosed herein, optionally packaged into the device 330 or the module 300 discussed below, may be advantageously used in a variety of electronic devices. Non-limiting examples of the electronic devices can include consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a peripheral device, a wrist watch, a clock, etc. Further, the electronic devices can include unfinished products.

Figure 24:
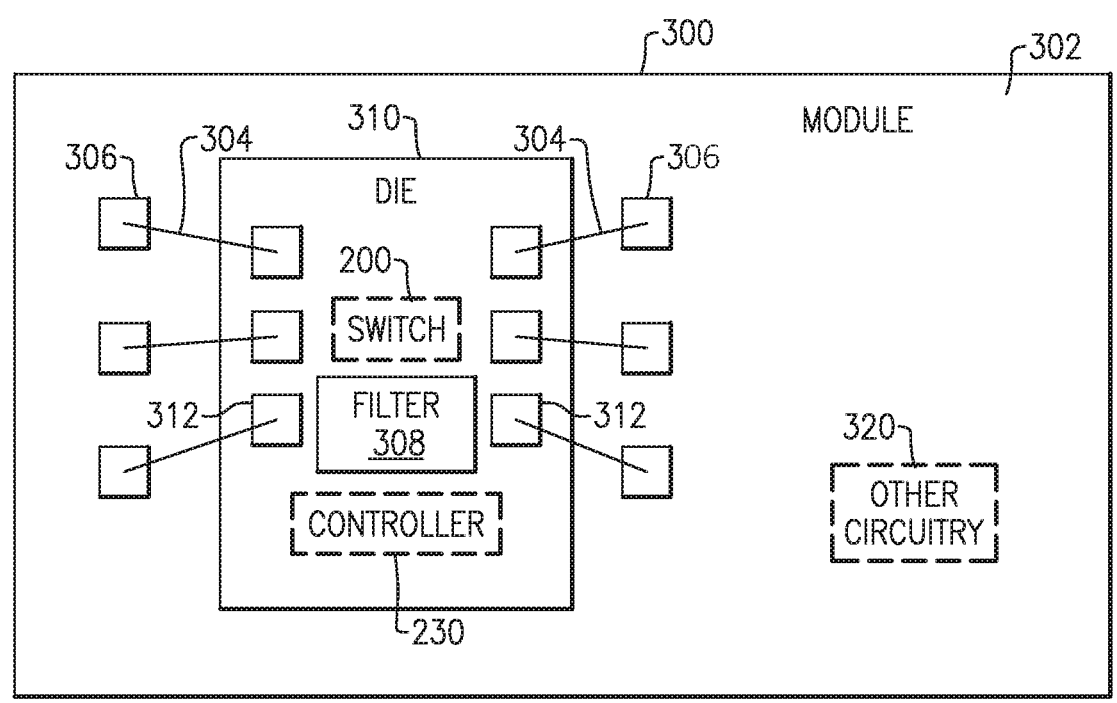
FIG. 24 is a block diagram one example of a module having one or more features according to aspects of the invention.

As discussed above, the support structures described herein may be used to package electronic devices such as a mobile communications device or other electronic device. FIG. 24 is a block diagram of one example of a module 300, such as an antenna switch module, that can include an embodiment of the structures described herein. The module 300 includes a packaging substrate 302 that is configured to receive a plurality of components. In some embodiments, such components can include a die 310 that is packaged according to one or more features as described herein. For example, the die 310 can be formed from a device substrate 130 as described above and may be packaged using one or more of the support structures such as the attachment structures, buttress structures, and/or filler structures, as described herein. The die may also include an acoustic wave filter 308, such as a SAW or BAW filter or other similar acoustic wave component, a switch 200, such as an antenna switch, and optionally other circuitry or components, such as a controller 230, for example. A plurality of connection pads 312 can facilitate electrical connections such as wirebonds 304 to connection pads 306 on the substrate 302 to facilitate passing of various power and signals to and from the die 310. In some embodiments, other circuitry or components 320 can be mounted on or formed on the packaging substrate 302. For example, the components 320 may include phase shifters, filter circuitry, modulators, demodulators, down converters, and the like, as would be known to one of skill in the art of semiconductor fabrication in view of the disclosure herein. In some embodiments, the packaging substrate 302 can include a laminate substrate.

In some embodiments, the module 300 can also be packaged using one or more of the support structures as described herein. For example, one or more of the support structures may be prepared according to the methods discussed herein to form one or more packaging structures with improved adhesion and mechanical strength. The resulting packaging structures may, for example, provide protection and facilitate easier handling of the module 300. In certain instances, the packaging structure may include an overmold formed over the packaging substrate 302 that is dimensioned to substantially encapsulate the various circuits and components thereon. It will be understood that although the module 300 is described in the context of wirebond-based electrical connections, one or more features of the present disclosure can also be implemented in other packaging configurations, including flip-chip configurations.

In some implementations, a device packaged according to one or more of the embodiments described herein can be included in an RF device such as a wireless device. The packaging structures described herein can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, modem, communication network, or any other portable or non-portable device configured for voice and/or data communication.

Figure 25:
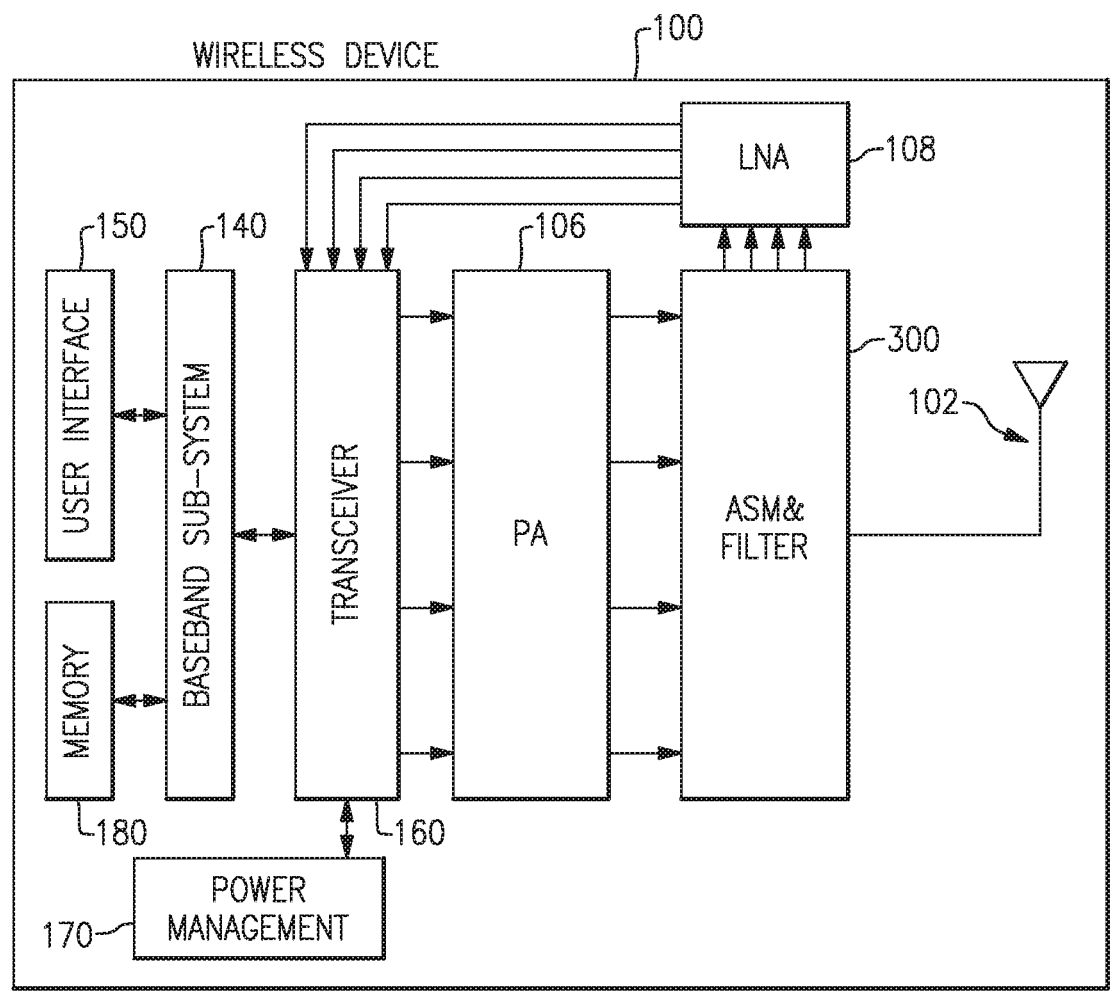
FIG. 25 is a block diagram of one example of a wireless device having one or more features according to aspects of the invention.

FIG. 25 is a block diagram of a wireless device 100 that, according to certain embodiments, may implement one or more of the support structures disclosed herein. The wireless device 100 can be a cellular phone, smart phone, tablet, modem, or any other portable or non-portable device configured for voice or data communications. The wireless device 100 includes an antenna 102 and can transmit and receive signals from the antenna 102.

The wireless device 100 further includes a transceiver 160. The transceiver 160 is configured to generate signals for transmission and/or to process received signals. Signals generated for transmission are received by the power amplifier (PA) 106, which amplifies the generated signals from the transceiver 160. Received signals are amplified by the low noise amplifier (LNA) 108 and then provided to the transceiver 160. The antenna switch module and filter component 300 can be configured to perform one or more functions. For instance, the antenna switch module portion of the component 300 can switch between different bands and/or modes, transmit and receive modes, etc. The acoustic wave filter of component 300 may be used to perform a filtering function of the signal so as to allow through desired channels(s). The antenna 102 both receives signals that are provided to the transceiver 160 via the antenna switch module and filter component 300 and the LNA 108, and also transmits signals from the wireless device 100 via the transceiver 160, the PA 106, and the antenna switch module and filter component 300. However, in other examples multiple antennas can be used. Although not shown in FIG. 25, the antenna switch module and filter component 300 may be implemented as separate components.

The power amplifier 106 can be used to amplify a wide variety of RF or other frequency-band transmission signals. For example, the power amplifier 106 can receive an enable signal that can be used to pulse the output of the power amplifier to aid in transmitting a wireless local area network (WLAN) signal or any other suitable pulsed signal. The power amplifier 106 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 106 and associated components, including switches and the like, can be fabricated on GaAs substrates using, for example, pHEMT or BiFET transistors, or on a Silicon substrate using CMOS transistors.

The wireless device 100 further includes a power management system 170 that is connected to the transceiver 160 and that manages the power for the operation of the wireless device 100. The power management system 160 can also control the operation of the baseband processing circuitry 140 and other components of the wireless device 100. The power management system provides power to the various components of the wireless device 100. Accordingly, in certain examples the power management system 170 may include a battery. Alternatively, the power management system 170 may be coupled to a battery (not shown).

The baseband processing circuitry 140 is shown to be connected to a user interface 150 to facilitate various input and output of voice and/or data provided to and received from a user. The baseband processing circuitry 140 can also be connected to a memory 180 that is configured to store data and/or instructions to facilitate the operation of the wireless device, and/or to provide storage of information for the user.

Process 200 illustrated in FIG. 2 depicts one particular sequence of acts in a particular embodiment. According to certain embodiments, some acts are optional and, as such, may be omitted. Additionally, the order of acts can be altered, or other acts can be added, without departing from the scope of the embodiments described herein. For instance, in process 200, a cure or partial cure of the structure material 120 may take place before and/or after exposure and/or after the device substrate 130 is attached. In addition, process 200 may include developing portions of the existing layers of structure material (act 210) prior to depositing additional layer(s) of structure material (act 204).

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A method of packaging an electronic device, the method comprising:
    depositing a layer of temporary bonding material onto a first substrate;
    depositing a layer of photosensitive polymer onto the temporary bonding material;
    masking at least a portion of the layer of photosensitive polymer to define an unmasked portion and a masked portion of the photosensitive polymer, the unmasked portion of the photosensitive polymer defining at least a portion of at least one support structure;
    performing at least a partial cure of the unmasked portion of the layer of photosensitive polymer;
    developing the masked portion of the layer of photosensitive polymer;
    attaching a second substrate to the unmasked portion of the photosensitive polymer, the second substrate including an electronic device and an encapsulation structure having a wall surrounding the electronic device, attaching the second substrate to the unmasked portion of the photosensitive polymer including aligning the at least one support structure with the encapsulation structure; and
    separating the first substrate from the unmasked portion of the layer of photosensitive polymer.

2. The method of claim 1 further comprising forming at least one opening through the layer of photosensitive polymer.

3. The method of claim 2 further comprising depositing a bonding material into the at least one opening.

4. The method of claim 3 wherein depositing the bonding material into the at least one opening includes depositing a metal into the at least one opening.

5. The method of claim 4 wherein the at least one support structure includes a sleeve in which the at least one opening is defined and a collar portion, wherein the method further includes depositing the bonding material on at least a portion of the collar portion.

6. The method of claim 1 wherein defining the unmasked portion and the masked portion of the photosensitive polymer includes defining a collar of the at least one support structure and a sleeve of the at least one support structure disposed within the collar, the sleeve at least partially surrounding an opening in the sleeve.

7. The method of claim 1 further comprising performing a full cure of the unmasked portion of the photosensitive polymer subsequent to attaching the second substrate to the unmasked portion of the photosensitive polymer.

8. The method of claim 1 wherein attaching the second substrate to the unmasked portion of the photosensitive polymer includes providing at least one of increased adhesion and mechanical strength to the encapsulation structure with the support structure.

9. The method of claim 1 wherein the unmasked portion of the photosensitive polymer defines a sleeve of the at least one support structure, and the method further comprises:
    depositing a layer of a second photosensitive polymer onto the layer of photosensitive polymer; and
    masking at least a portion of the second photosensitive polymer to define an unmasked portion and a masked portion of the second photosensitive polymer, the unmasked portion of the second photosensitive polymer defining a collar of the support structure.

10. The method of claim 1 wherein attaching the second substrate to the unmasked portion of the photosensitive polymer includes positioning the at least one support structure at multiple locations adjacent the wall of the encapsulation structure.

11. The method of claim 10 wherein attaching the second substrate to the unmasked portion of the photosensitive polymer further includes attaching at least one collar of the at least one support structure to the wall of the encapsulation structure.

12. The method of claim 1 wherein attaching the second substrate to the unmasked portion of the photosensitive polymer includes forming a portion of a lid of the encapsulation structure with at least a portion of at least one collar of the at least one support structure, the lid of the encapsulation structure being attached to at least a portion of the wall of the encapsulation structure.

13. The method of claim 1 wherein attaching the second substrate to the unmasked portion of the photosensitive polymer includes positioning the at least one support structure adjacent at least one corner of the encapsulation structure, the at least one support structure forming a buttress extending outward from the wall of the encapsulation structure, the buttress including a hollow region at least partially filled with a filler material.

14. The method of claim 1 wherein defining the unmasked portion and the masked portion of the photosensitive polymer includes defining the at least one support structure with at least one dimension that is substantially the same as a dimension of the wall, the at least one dimension including at least one of a width and a vertical cross-section.

* * * * *